US012683606B2

(12) United States Patent
Arimura

(10) Patent No.: US 12,683,606 B2
(45) Date of Patent: Jul. 14, 2026

(54) SIGNAL TRANSMISSION DEVICE AND ELECTRONIC DEVICE

(71) Applicant: ROHM CO., LTD., Kyoto (JP)

(72) Inventor: Masahiko Arimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/744,450

(22) Filed: Jun. 14, 2024

(65) Prior Publication Data

US 2024/0340007 A1     Oct. 10, 2024

Related U.S. Application Data

(63) Continuation of application No. PCT/JP2022/039712, filed on Oct. 25, 2022.

(30) Foreign Application Priority Data

Dec. 16, 2021    (JP) ................................. 2021-204464

(51) Int. Cl.
  *H03K 17/691*     (2006.01)
  *H03K 19/0175*     (2006.01)
(52) U.S. Cl.
  CPC ....... *H03K 17/691* (2013.01); *H03K 19/0175* (2013.01)
(58) Field of Classification Search
  CPC ......................... H03K 17/691; H03K 19/0175
  See application file for complete search history.

(56) References Cited

U.S. PATENT DOCUMENTS

| | | | | |
|---|---|---|---|---|
| 5,786,687 A | * | 7/1998 | Faulk | H03K 17/04123 |
| | | | | 323/289 |
| 6,720,816 B2 | * | 4/2004 | Strzalkowski | H04L 25/0266 |
| | | | | 327/306 |
| 6,836,161 B2 | * | 12/2004 | Akiyama | H03K 17/785 |
| | | | | 327/108 |

(Continued)

FOREIGN PATENT DOCUMENTS

JP        2018-011108        1/2018

OTHER PUBLICATIONS

International Search Report and Written Opinion in International Appln. No. PCT/JP2022/039712, mailed on Jan. 17, 2023, 12 pages (with machine translation).

(Continued)

*Primary Examiner* — Menatoallah Youssef
*Assistant Examiner* — Khareem E Almo
(74) *Attorney, Agent, or Firm* — Fish & Richardson P.C.

(57)        ABSTRACT

A signal transmission device includes a logic in a primary circuit system, a logic and a driver in a secondary circuit system, and a first and a second transformer circuit that transmit driving pulse signals and feedback pulse signals between the logics while isolating between the primary and secondary circuit systems. The second logic has a function of determining the logic level of a gate signal by driving the driver according to the driving pulse signals, a function of pulse-driving the feedback pulse signals at a predetermined period, with a first number of pulses at a time, if the secondary circuit system is in normal condition, and a function of switching the first number of pulses according to the driving capacity of the driver.

20 Claims, 17 Drawing Sheets

(56)    References Cited

U.S. PATENT DOCUMENTS

| | | | |
|---|---|---|---|
| 7,560,833 B2 * | 7/2009 | Strzalkowski .......... | H02M 1/08 |
| | | | 307/139 |
| 10,396,675 B2 * | 8/2019 | Hayasaki .......... | H02M 3/33584 |
| 11,489,522 B2 * | 11/2022 | Nuebling ............. | H03K 17/689 |
| 2015/0137843 A1 * | 5/2015 | Yanagishima ......... | G01R 31/27 |
| | | | 324/750.3 |
| 2020/0280313 A1 * | 9/2020 | Rinne ............... | H02M 3/33576 |
| 2022/0311433 A1 * | 9/2022 | Miatton ............... | H03K 17/567 |
| 2025/0038670 A1 * | 1/2025 | Perrotta ................ | H03K 17/18 |

OTHER PUBLICATIONS

JP OA—Japanese Patent Office, Office Action in Japanese Appln. No. 2023-567580, dated May 19, 2026, 10 pages (with English Translation).

* cited by examiner

FIG.13

| SEL | TR1 | OUTL | OUTLS | OSFBH OSFBL | BIST |
|-----|-----|------|-------|-------------|------|
| H | OFF2 | on (GND) | on (GND) | x2 | H |
| L | OFF1 | on (GND) | off (HiZ) | x1 | L |

SIGNAL TRANSMISSION DEVICE AND ELECTRONIC DEVICE

CROSS-REFERENCE TO RELATED APPLICATIONS

This nonprovisional application is a continuation application of International Patent Application No. PCT/JP2022/039712 filed on Oct. 25, 2022, which claims priority Japanese Patent Application No. 2021-204464 filed on Dec. 16, 2021, the entire contents of which are hereby incorporated by reference.

TECHNICAL FIELD

The disclosure herein relates to signal transmission devices, and also relates to electronic devices incorporating signal transmission devices.

BACKGROUND ART

Today, signal transmission devices that transmit a pulse signal while isolating between input and output are used in a variety of applications (such as in power supply devices and motor driving devices).

One example of known technology related to what has just been mentioned is seen in Patent Document 1 identified below.

CITATION LIST

Patent Literature

Patent Document 1: JP-A-2018-011108

BRIEF DESCRIPTION OF DRAWINGS

FIG. 13 is a diagram showing the states of a gate-off capacity selection signal and different parts in the device.

DESCRIPTION OF EMBODIMENTS

<Signal Transmission Device (Basic Configuration)>

Figure 1:
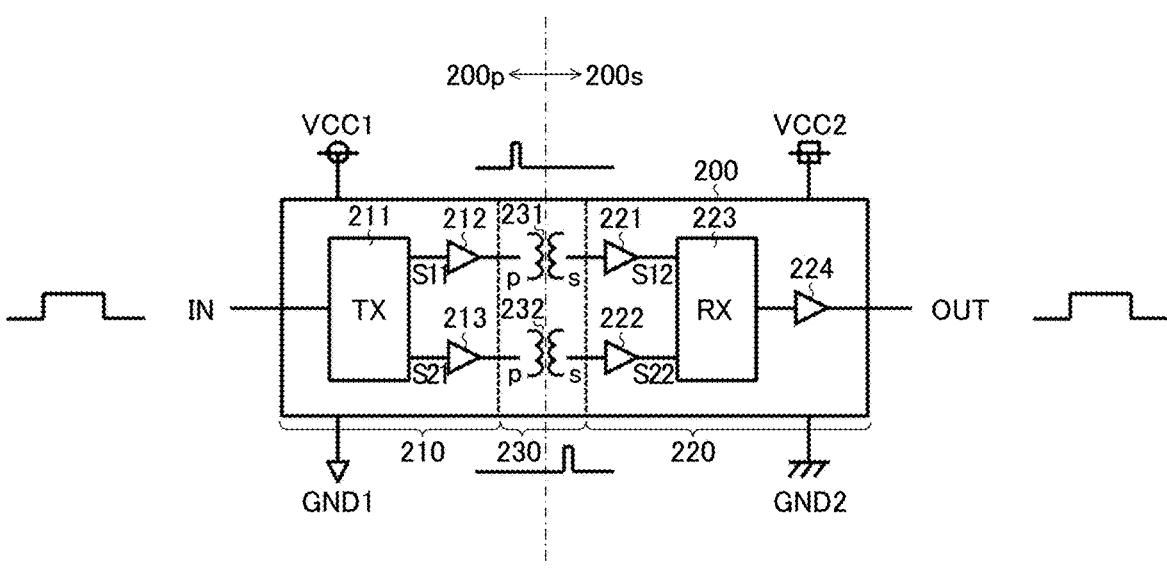
FIG. 1 is a diagram illustrating the basic configuration of a signal transmission device.

FIG. 1 is a diagram illustrating the basic configuration of a signal transmission device. The signal transmission device 200 of this configuration example is a semiconductor integrated circuit device (what is generally called an isolated gate driver IC) that, while isolating between a primary circuit system 200$p$ (VCC1-GND1 system) and a secondary circuit system 200$s$ (VCC2-GND2 system), transmits a pulse signal from the primary circuit system 200$p$ to the secondary circuit system 200$s$ to drive the gate of a switching device (unillustrated) provided in the secondary circuit system 200$s$. The signal transmission device 200 has, for example, a controller chip 210, a driver chip 220, and a transformer chip 230 sealed in a single package.

The controller chip 210 is a semiconductor chip that operates by being supplied with a supply voltage VCC1 (e.g., seven volts at the maximum with respect to GND1). The controller chip 210 has, for example, a pulse transmission circuit 211 and buffers 212 and 213 integrated in it.

The pulse transmission circuit 211 is a pulse generator that generates transmission pulse signals S11 and S21 according to an input pulse signal IN. More specifically, when indicating that the input pulse signal IN is at high level, the pulse transmission circuit 211 pulse-drives (outputs a single or a plurality of pulses in) the transmission pulse signal S11; when indicating that the input pulse signal IN is at low level, the pulse transmission circuit 211 pulse-drives the transmission pulse signal S21. That is, the pulse transmission circuit 211 pulse-drives either the transmission pulse signal S11 or S21 according to the logic level of the input pulse signal IN.

The buffer 212 receives the transmission pulse signal S11 from the pulse transmission circuit 211, and pulse-drives the transformer chip 230 (more specifically, a transformer 231).

The buffer 213 receives the transmission pulse signal S21 from the pulse transmission circuit 211, and pulse-drives the transformer chip 230 (more specifically, a transformer 232).

The driver chip 220 is a semiconductor chip that operates by being supplied with a supply voltage VCC2 (e.g., 30 volts at the maximum with respect to GND2). The driver chip 220 has, for example, buffers 221 and 222, a pulse reception circuit 223, and a driver 224 integrated in it.

The buffer 221 performs waveform shaping on a reception pulse signal S12 induced in the transformer chip 230 (specifically, the transformer 231), and outputs the result to the pulse reception circuit 223.

The buffer 222 performs waveform shaping on a reception pulse signal S22 induced in the transformer chip 230 (specifically, the transformer 232), and outputs the result to the pulse reception circuit 223.

According to the reception pulse signals S12 and S22 fed to it via the buffers 221 and 222, the pulse reception circuit 223 drivers the driver 224 to generate an output pulse signal OUT. More specifically, the pulse reception circuit 223 drives the driver 224 to raise the output pulse signal OUT to high level in response to the reception pulse signal S12 being pulse-driven and to drop the output pulse signal OUT to low level in response to the reception pulse signal S22 being pulse-driven. That is, the pulse reception circuit 223 switches the logic level of the output pulse signal OUT according to the logic level of the input pulse signal IN. As the pulse reception circuit 223, for example, an RS flip-flop can be suitably used.

The driver 224 generates the output pulse signal OUT under the driving and control of the pulse reception circuit 223.

The transformer chip 230, while isolating between the controller chip 210 and the driver chip 220 on a direct-current basis using the transformers 231 and 232, outputs the transmission pulse signals S11 and S21 fed to the transformer chip 230 from the pulse transmission circuit 211 to, as the reception pulse signals S12 and S22, the pulse reception circuit 223. In the present description, "isolating on a direct-current basis" means leaving two elements to be isolated from each other unconnected by a conductor.

More specifically, the transformer 231 outputs, according to the transmission pulse signal S11 fed to the primary coil 231p, the reception pulse signal S12 from the secondary coil 231s. Likewise, the transformer 232 outputs, according to the transmission pulse signal S21 fed to the primary coil 232p, the reception pulse signal S22 from the secondary coil 232s.

In this way, owing to the characteristics of spiral coils used in isolated communication, the input pulse signal IN is split into two transmission pulse signals S11 and S21 (corresponding to a rise signal and a fall signal) to be transmitted via the two transformers 231 and 232 from the primary circuit system 200p to the secondary circuit system 200s.

Note that the signal transmission device 200 of this configuration example has, separately from the controller chip 210 and the driver chip 220, the transformer chip 230 that incorporates the transformers 231 and 232 alone, and those three chips are sealed in a single package.

With this configuration, the controller chip 210 and the driver chip 220 can each be formed by a common low- to middle-withstand-voltage process (with a withstand voltage of several volts to several tens of volts). This eliminates the need for a dedicated high-withstand-voltage process (with a withstand voltage of several kilovolts), and helps reduce manufacturing costs.

The signal transmission device 200 can be employed suitably, for example, in a power supply device or motor driving device in a vehicle-mounted device incorporated in a vehicle. Such a vehicle can be an engine vehicle or an electric vehicle (an xEV such as a BEV [battery electric vehicle], HEV [hybrid electric vehicle], PHEV/PHV [plug-in hybrid electric vehicle/plug-in hybrid vehicle], or FCEV/FCV [fuel cell electric vehicle/fuel cell vehicle]).

<Transformer Chip (Basic Structure)>

Figure 2:
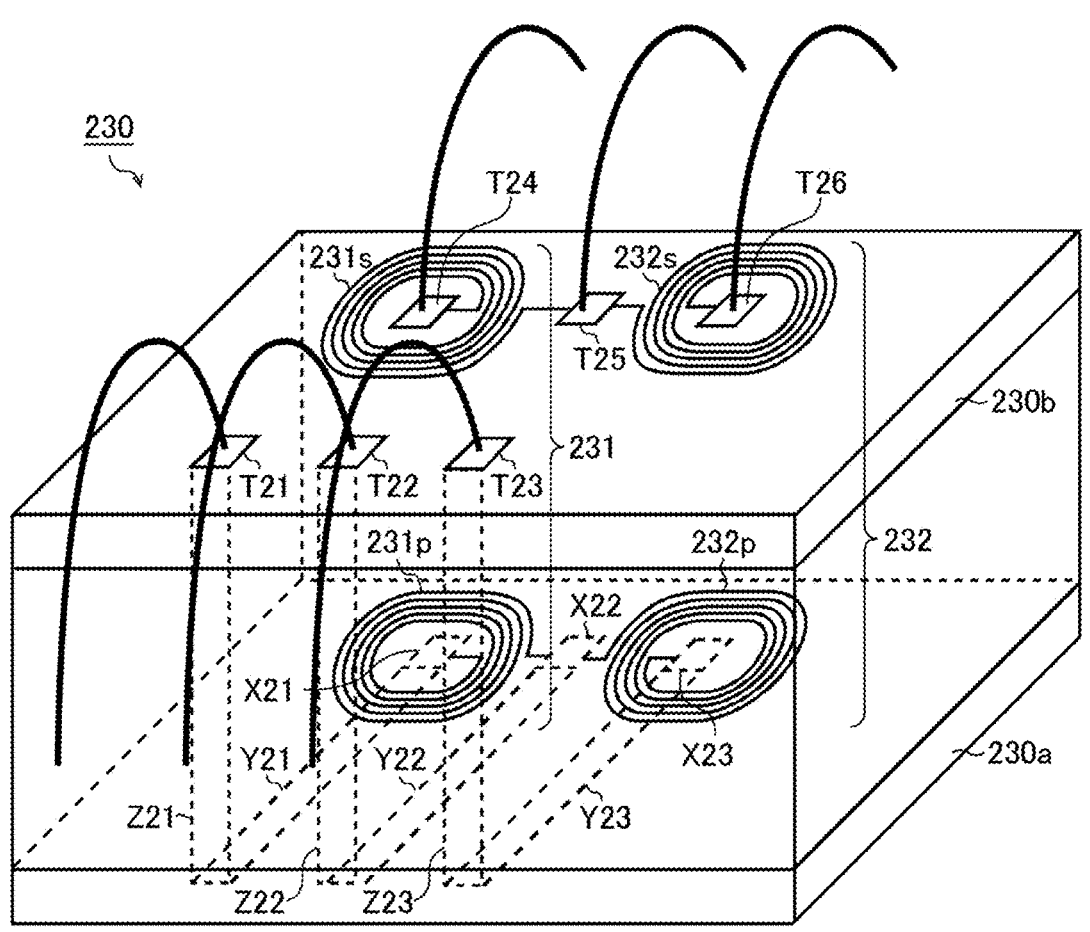
FIG. 2 is a diagram illustrating the basic structure of a transformer chip.

Next, the basic structure of the transformer chip 230 will be described. FIG. 2 is a diagram showing the basic structure of the transformer chip 230. In the transformer chip 230 shown there, the transformer 231 includes a primary coil 231p and a secondary coil 231s that face each other in the up-down direction; the transformer 232 includes a primary coil 232p and a secondary coil 232s that face each other in the up-down direction.

The primary coils 231p and 232p are both formed in a first wiring layer (lower layer) 230a in the transformer chip 230. The secondary coils 231s and 231s are both formed in a second wiring layer (the upper layer in the diagram) 230b in the transformer chip 230. The secondary coil 231s is disposed right above the primary coil 231p and faces the primary coil 231p; the secondary coil 232s is disposed right above the primary coil 232p and faces the primary coil 232p.

The primary coil 231p is laid in a spiral shape so as to encircle an internal terminal X21 clockwise, starting at the first terminal of the primary coil 231p, which is connected to the internal terminal X21. The second terminal of the primary coil 231p, which corresponds to its end point, is connected to an internal terminal X22. Likewise, the primary coil 232p is laid in a spiral shape so as to encircle an internal terminal X23 anticlockwise, starting at the first terminal of the primary coil 232p, which is connected to the internal terminal X23. The second terminal of the primary coil 232p, which corresponds to its end point, is connected to the internal terminal X22. The internal terminals X21, X22, and X23 are arrayed on a straight line in the illustrated order.

The internal terminal X21 is connected, via a wiring Y21 and a via Z21 both conductive, to an external terminal T21 in the second layer 230b. The internal terminal X22 is connected, via a wiring Y22 and a via Z22 both conductive, to an external terminal T22 in the second layer 230b. The internal terminal X23 is connected, via a wiring Y23 and a via Z23 both conductive, to an external terminal T23 in the second layer 230b. The external terminals T21 to T23 are disposed in a straight row and are used for wire-bonding with the controller chip 210.

The secondary coil 231s is laid in a spiral shape so as to encircle an external terminal T24 anticlockwise, starting at the first terminal of the secondary coil 231s, which is connected to the external terminal T24. The second terminal of the secondary coil 231s, which corresponds to its end point, is connected to an external terminal T25. Likewise, the secondary coil 232s is laid in a spiral shape so as to encircle an external terminal T26 clockwise, starting at the first terminal of the secondary coil 232s, which is connected to the external terminal T26. The second terminal of the secondary coil 232s, which corresponds to its end point, is connected to the external terminal T25. The external terminals T24, T25, and T26 are disposed in a straight row in the illustrated order and are used for wire-bonding with the driver chip 220.

The secondary coils 231s and 232s are AC-connected to the primary coils 231p and 232p, respectively, by magnetic coupling, and are DC-isolated from the primary coils 231p and 232p. That is, the driver chip 220 is AC-connected to the controller chip 210 via the transformer chip 230, and is DC-isolated from the controller chip 210 by the transformer chip 230.

<Transformer Chip (Two-Channel Type)>

Figure 3:
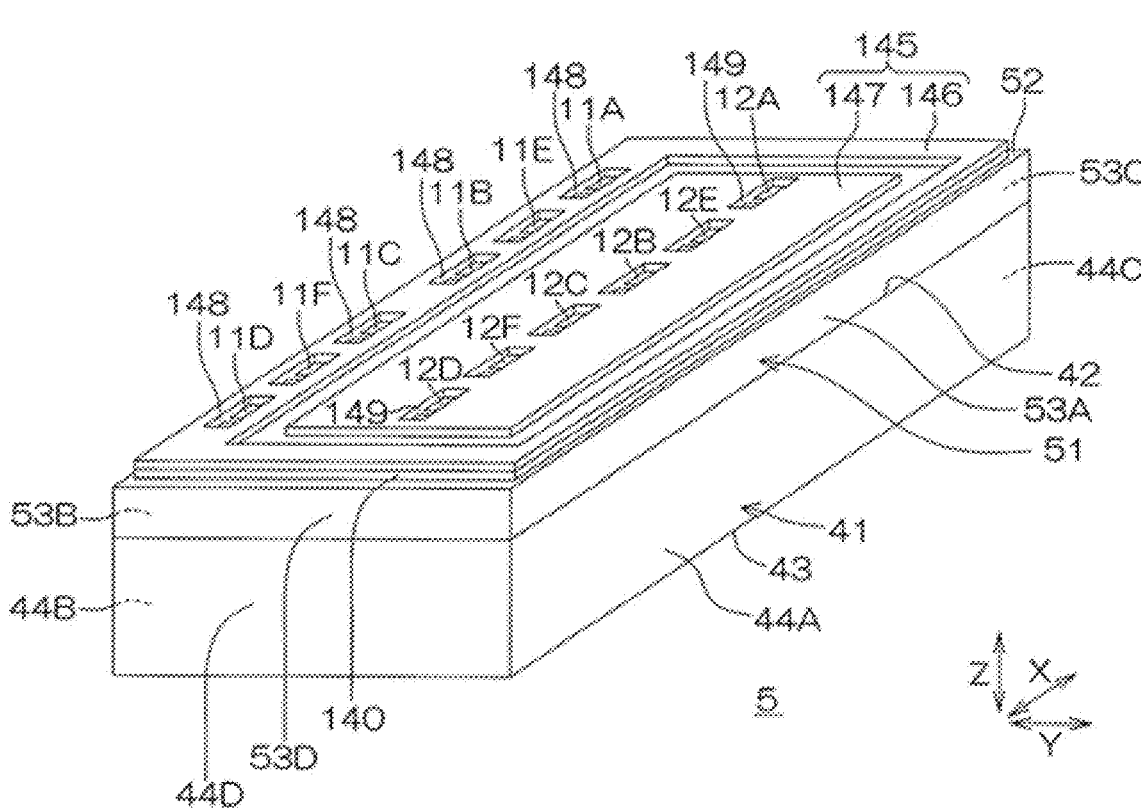
FIG. 3 a perspective view of a semiconductor device used as a two-channel transformer chip.
Figure 4:
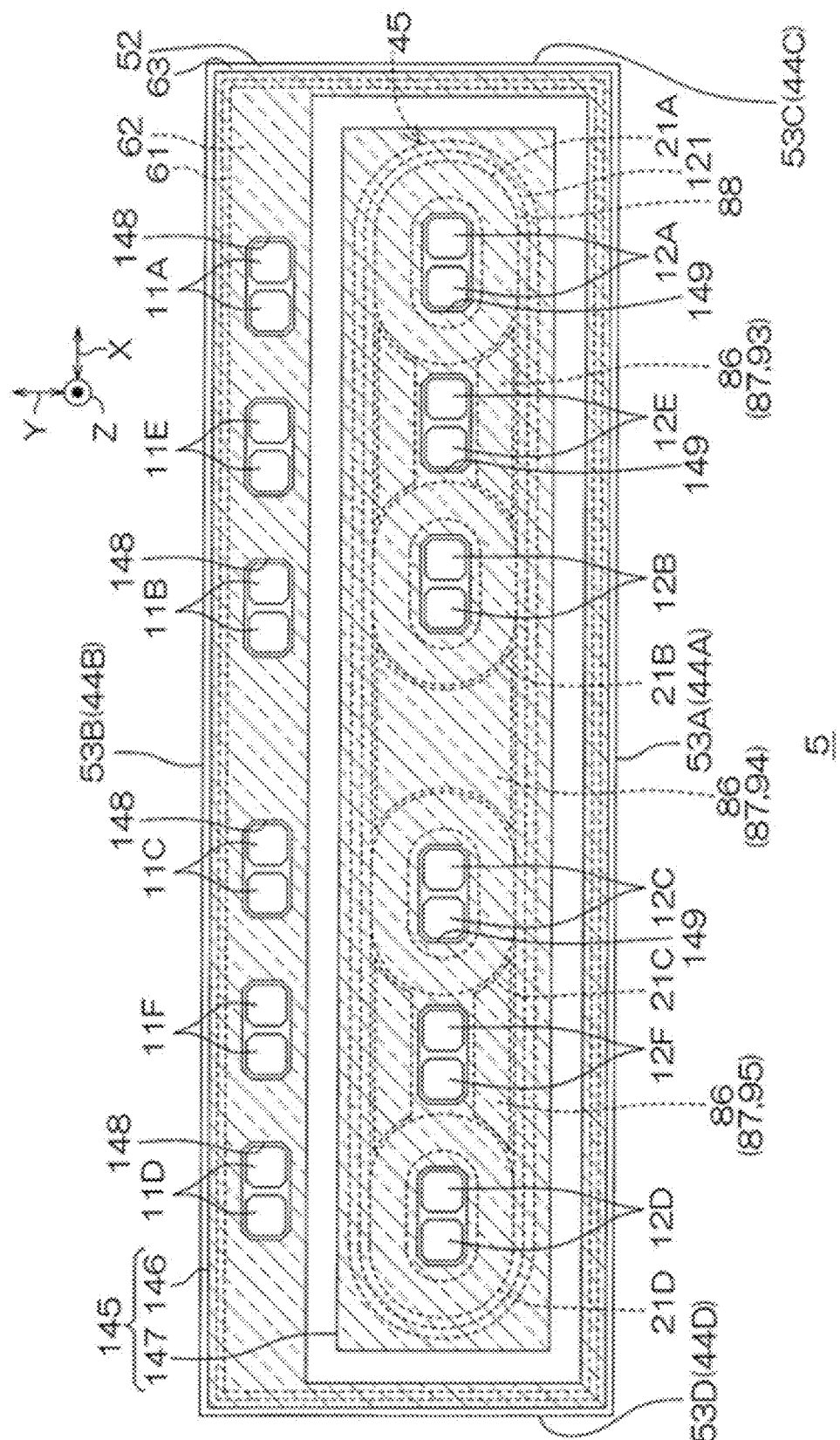
FIG. 4 is a plan view of the semiconductor device shown in FIG. 3.
Figure 5:
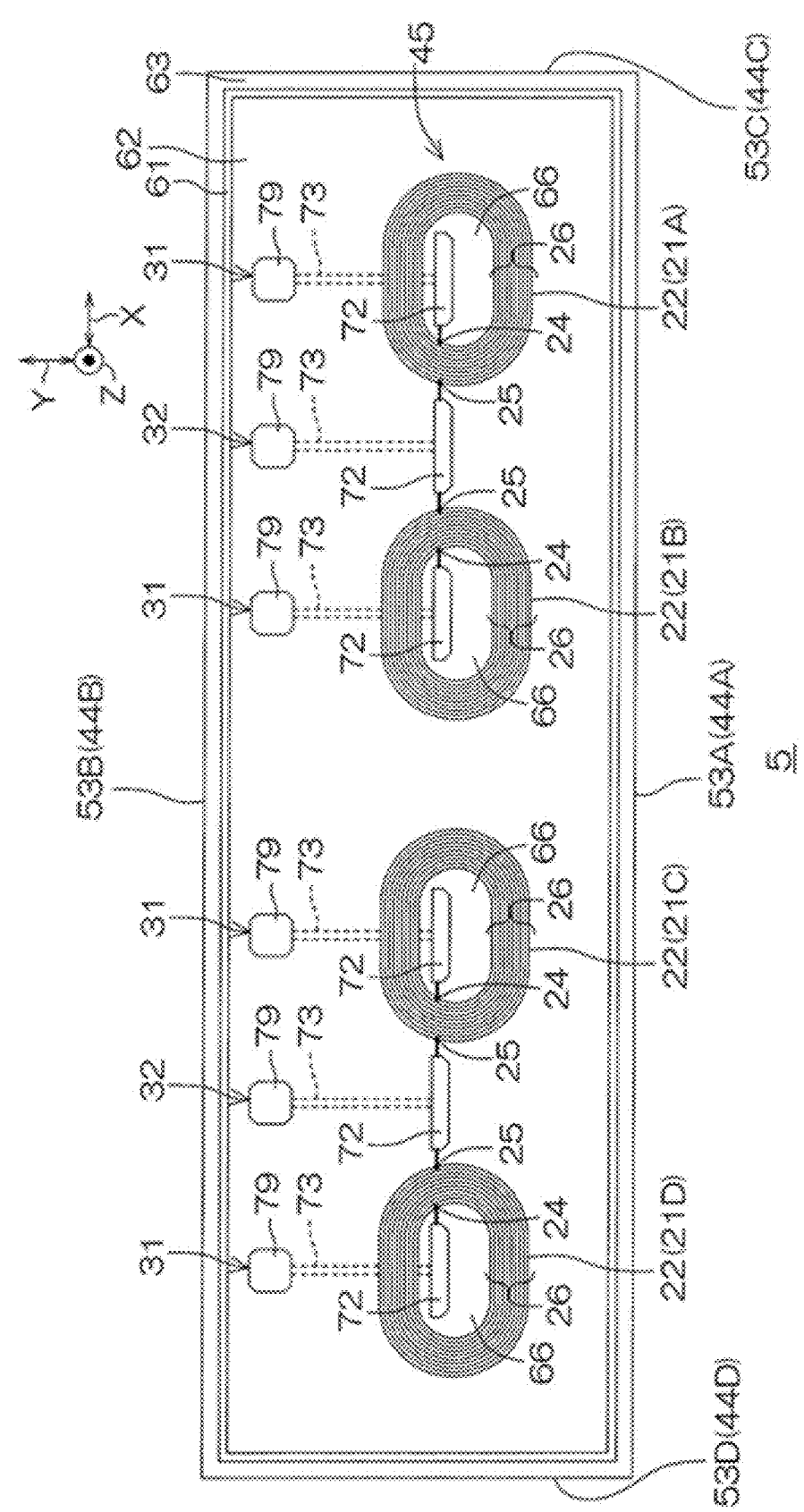
FIG. 5 is a plan view of a layer in the semiconductor device shown in FIG. 3 where low-potential coils are formed.
Figure 6:
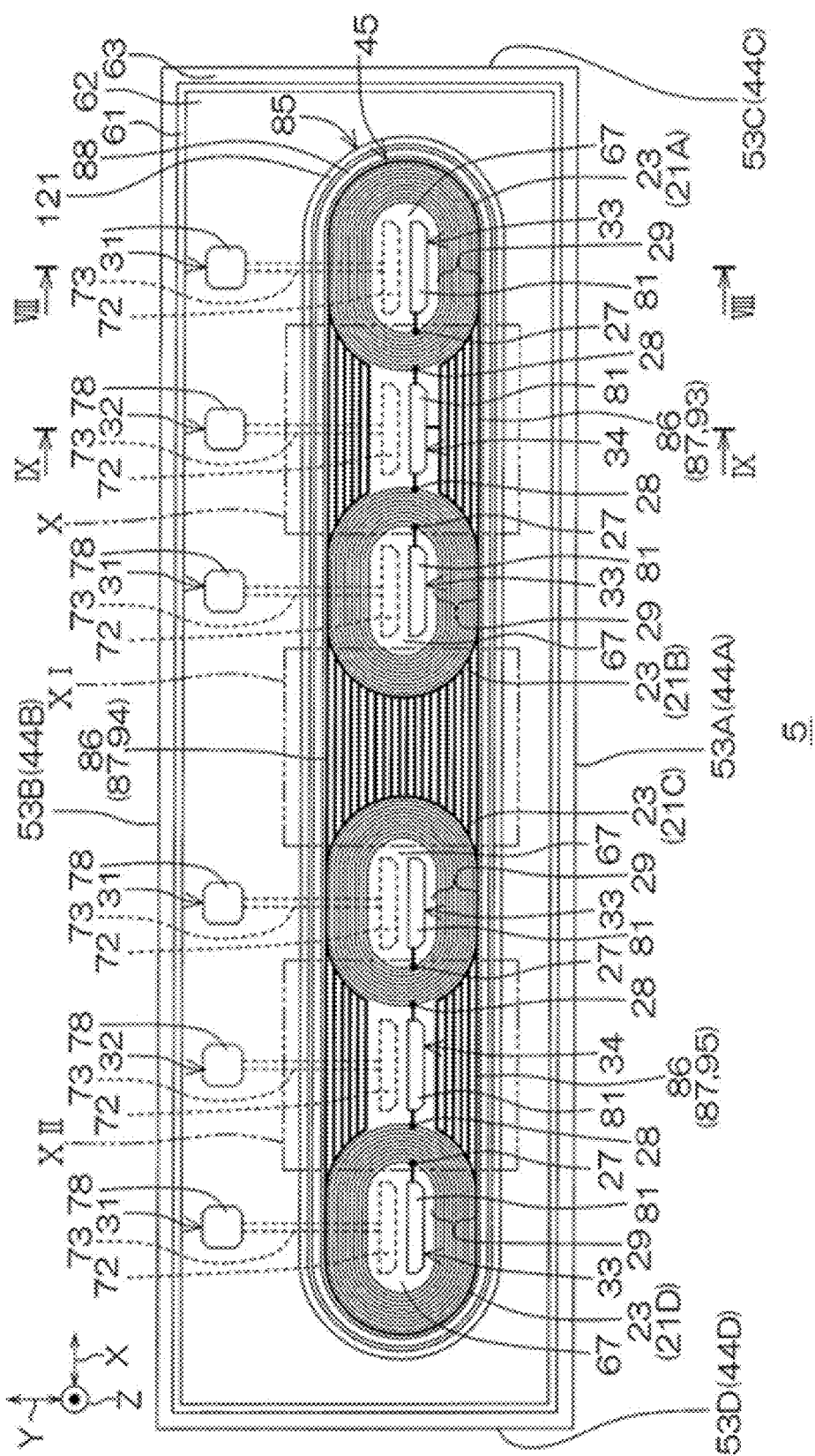
FIG. 6 is a plan view of a layer in the semiconductor device shown in FIG. 3 where high-potential coils are formed.
Figure 7:
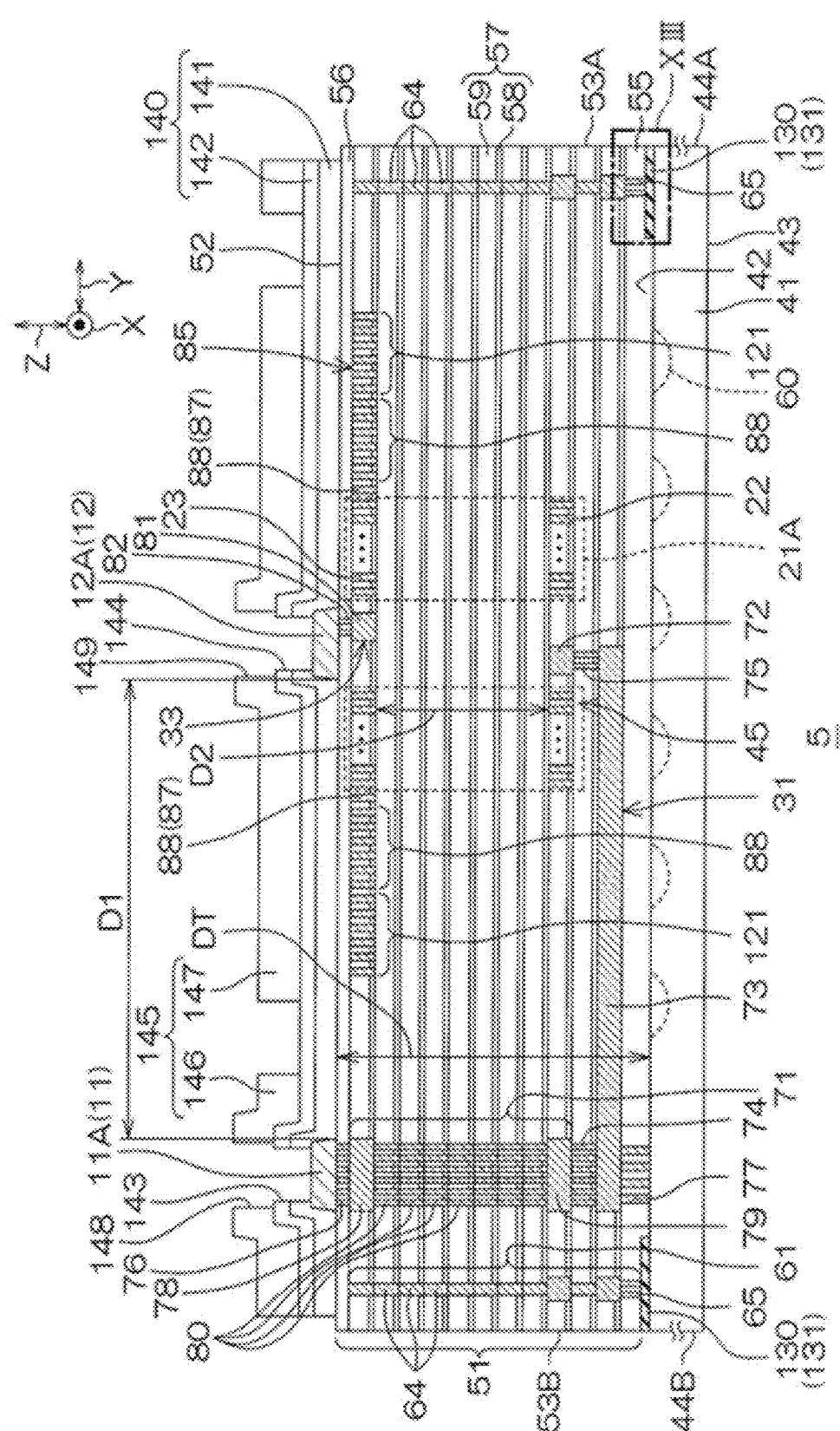
FIG. 7 is a cross-sectional view taken along line VIII-VIII shown in FIG. 6.

FIG. 3 is a perspective view of a semiconductor device 5 used as a two-channel transformer chip. FIG. 4 is a plan view of the semiconductor device 5 shown in FIG. 3. FIG. 5 is a plan view showing a layer in the semiconductor device 5 shown in FIG. 3 where low-potential coils 22 (corresponding to the primary coils of transformers) are formed. FIG. 6 is a plan view showing a layer in the semiconductor device 5 shown in FIG. 3 where high-potential coils 23 (corresponding to the secondary coils of transformers) are formed. FIG. 7 is a sectional view along line VIII-VIII shown in FIG. 6.

Referring to FIGS. 3 to 7, the semiconductor device 5 includes a semiconductor chip 41 in the shape of a rectangular parallelepiped. The semiconductor chip 41 contains at least one of silicon, a wide band gap semiconductor, and a compound semiconductor.

The wide band gap semiconductor is a semiconductor with a band gap larger than that of silicon (about 1.12 eV).

Preferably, the wide band gap semiconductor has a band gap of 2.0 eV or more. The wide band gap semiconductor can be SiC (silicon carbide). The compound semiconductor can be a III-V group compound semiconductor. The compound semiconductor can contain at least one of aluminum nitride (AlN), indium nitride (InN), gallium nitride (GaN), and gallium arsenide (GaAs).

In the embodiment, the semiconductor chip 41 includes a semiconductor substrate made of silicon. The semiconductor chip 41 can be an epitaxial substrate that has a stacked structure composed of a semiconductor substrate made of silicon and an epitaxial layer made of silicon. The semiconductor substrate can be of an n-type or p-type conductivity. The epitaxial layer can be of an n-type or p-type.

The semiconductor chip 41 has a first principal surface 42 at one side, a second principal surface 43 at the other side, and chip side walls 44A to 44D that connect the first and second principal surfaces 42 and 43 together. As seen in a plan view from the normal direction Z to them (hereinafter simply expressed as "as seen in a plan view"), the first and second principal surfaces 42 and 43 are each formed in a quadrangular shape (in the embodiment, in a rectangular shape).

The chip side walls 44A to 44D includes a first chip side wall 44A, a second chip side wall 44B, a third chip side wall 44C, and a fourth chip side wall 44D. The first and second chip side walls 44A and 44B constitute the longer sides of the semiconductor chip 41. The first and second chip side walls 44A and 44B extend along a first direction X and face away from each other in a second direction Y. The third and fourth chip side walls 44C and 44D constitute the shorter sides of the semiconductor chip 41. The third and fourth chip side walls 44C and 44D extend in the second direction Y and face away from each other in the first direction X. The chip side walls 44A to 44D have polished surfaces.

The semiconductor device 5 further includes an insulation layer 51 formed on the first principal surface 42 of the semiconductor chip 41. The insulation layer 51 has an insulation principal surface 52 and insulation side walls 53A to 53D. The insulation principal surface 52 is formed in a quadrangular shape (in the embodiment, a rectangular shape) that fits the first principal surface 42 as seen in a plan view. The insulation principal surface 52 extends parallel to the first principal surface 42.

The insulation side walls 53A to 53D include a first insulation side wall 53A, a second insulation side wall 53B, a third insulation side wall 53C, and a fourth insulation side wall 53D. The insulation side walls 53A to 53D extend from the circumferential edge of the insulation principal surface 52 toward the semiconductor chip 41, and are continuous with the chip side walls 44A to 44D. Specifically, the insulation side walls 53A to 53D are formed to be flush with the chip side walls 44A to 44D. The insulation side walls 53A to 53D constitute polished surfaces that are flush with the chip side walls 44A to 44D.

The insulation layer 51 has a stacked structure of multilayer insulation layers that include a bottom insulation layer 55, a top insulation layer 56, and a plurality of (in the embodiment, eleven) interlayer insulation layers 57. The bottom insulation layer 55 is an insulation layer that directly covers the first principal surface 42. The top insulation layer 56 is an insulation layer that constitutes the insulation principal surface 52. The plurality of interlayer insulation layers 57 are insulation layers that are interposed between the bottom and top insulation layers 55 and 56. In the embodiment, the bottom insulation layer 55 has a single-layer structure that contains silicon oxide. In the embodiment, the top insulation layer 56 has a single-layer structure that contains silicon oxide. The bottom and top insulation layers 55 and 56 can each have a thickness of 1 μm or more but 3 μm or less (e.g., about 2 μm).

The plurality of interlayer insulation layers 57 each have a stacked structure that includes a first insulation layer 58 at the bottom insulation layer 55 side and a second insulation layer 59 at the top insulation layer 56 side. The first insulation layer 58 can contain silicon nitride. The first insulation layer 58 is formed as an etching stopper layer for the second insulation layer 59. The first insulation layer 58 can have a thickness of 0.1 μm or more but 1 μm or less (e.g., about 0.3 μm).

The second insulation layer 59 is formed on top of the first insulation layer 58, and contains an insulating material different from that of the first insulation layer 58. The second insulation layer 59 can contain silicon oxide. The second insulation layer 59 can have a thickness of 1 μm or more but 3 μm or less (e.g., about 2 μm). Preferably, the second insulation layer 59 is given a thickness larger than that of the first insulation layer 58.

The insulation layer 51 can have a total thickness DT of 5 μm or more but 50 μm or less. The insulation layer 51 can have any total thickness DT and any number of interlayer insulation layers 57 stacked together, which are adjusted according to the desired dielectric strength voltage (dielectric breakdown withstand voltage). The bottom insulation layer 55, the top insulation layer 56, and the interlayer insulation layers 57 can employ any insulating material, which is thus not limited to any particular insulating material.

The semiconductor device 5 includes a first functional device 45 formed in the insulation layer 51. The first functional device 45 includes one or a plurality of (in the embodiment, a plurality of) transformers 21 (corresponding the transformers mentioned previously). That is, the semiconductor device 5 is a multichannel device that includes a plurality of transformers 21. The plurality of transformers 21 are formed in an inner part of the insulation layer 51, at intervals from the insulation side walls 53A to 53D. The plurality of transformers 21 are formed at intervals from each other in the first direction X.

Specifically, the plurality of transformers 21 include a first transformer 21A, a second transformer 21B, a third transformer 21C, and a fourth transformer 21D that are formed in this order from the insulation side wall 53C side to the insulation side wall 53D side as seen in a plan view. The plurality of transformers 21A to 21D have similar structures. In the following description, the structure of the first transformer 21A will be described as an example. No separate description will be given of the structures of the second, third, and fourth transformers 21B, 21C, and 21D, to which the description of the structure of the first transformer 21A is to be taken to apply.

Referring to FIGS. 5 to 7, the first transformer 21A includes a low-potential coil 22 and a high-potential coil 23. The low-potential coil 22 is formed in the insulation layer 51. The high-potential coil 23 is formed in the insulation layer 51 so as to face the low-potential coil 22 in the normal direction Z. In the embodiment, the low- and high-potential coils 22 and 23 are formed in a region between the bottom and top insulation layers 55 and 56 (i.e., in the plurality of interlayer insulation layer 57).

The low-potential coil 22 is formed in the insulation layer 51, at the bottom insulation layer 55 (semiconductor chip 41) side, and the high-potential coil 23 is formed in the insulation layer 51, at the top insulation layer 56 (insulation principal surface 52) side with respect to the low-potential coil 22. That is, the high-potential coil 23 faces the semiconductor chip 41 across the low-potential coil 22. The low- and high-potential coils 22 and 23 can be disposed at any places. The high-potential coil 23 can face the low-potential coil 22 across one or more interlayer insulation layers 57.

The distance between the low- and high-potential coils 22 and 23 (i.e., the number of interlayer insulation layers 57 stacked together) is adjusted appropriately according to the dielectric strength voltage and electric field strength between the low- and high-potential coils 22 and 23. In the embodiment, the low-potential coil 22 is formed in the third interlayer insulation layer 57 as counted from the bottom insulation layer 55 side. In the embodiment, the high-potential coil 23 is formed in the first interlayer insulation layer 57 as counted from the top insulation layer 56 side.

The low-potential coil 22 is embedded in the interlayer insulation layer 57 so as to penetrate the first and second insulation layers 58 and 59. The low-potential coil 22 includes a first inner end 24, a first outer end 25, and a first spiral portion 26 that is patterned in a spiral shape between the first inner and outer ends 24 and 25. The first spiral portion 26 is patterned in a spiral shape that extends in an elliptical (oval) shape as seen in a plan view. The part of the first spiral portion 26 that forms its inner circumferential edge defines a first inner region 66 that is in an elliptical shape as seen in a plan view.

The first spiral portion 26 can have a number of turns of 5 or more but 30 or less. The first spiral portion 26 can have a width of 0.1 μm or more but 5 μm or less. Preferably, the first spiral portion 26 has a width of 1 μm or more but 3 μm or less. The width of the first spiral portion 26 is defined by its width in the direction orthogonal to the spiraling direction. The first spiral portion 26 has a first winding pitch of 0.1 μm or more but 5 μm or less. Preferably, the first winding pitch is 1 μm or more but 3 μm or less. The first winding pitch is defined by the distance between two parts of the first spiral portion 26 that are adjacent to each other in the direction orthogonal to the spiraling direction.

The first spiral portion 26 can have any winding shape and the first inner region 66 can have any planar shape, which are thus not limited to those shown in FIG. 5 etc. The first spiral portion 26 can be wound in a polygonal shape, such as a triangular or quadrangular shape, or in a circular shape as seen in a plan view. The first inner region 66 can be defined, so as to fit the winding shape of the first spiral portion 26, in a polygonal shape, such as a triangular or quadrangular shape, or in a circular shape as seen in a plan view.

The low-potential coil 22 can contain at least one of titanium, titanium nitride, copper, aluminum, and tungsten. The low-potential coil 22 can have a stacked structure composed of a barrier layer and a body layer. The barrier layer defines a recessed space in the interlayer insulation layer 57. The barrier layer can contain at least one of titanium and titanium nitride. The body layer can contain at least one of copper, aluminum, and tungsten.

The high-potential coil 23 is embedded in the interlayer insulation layer 57 so as to penetrate the first and second insulation layers 58 and 59. The high-potential coil 23 includes a second inner end 27, a second outer end 28, and a second spiral portion 29 that is patterned in a spiral shape between the second inner and outer ends 27 and 28. The second spiral portion 29 is patterned in a spiral shape that extends in an elliptical (oval) shape as seen in a plan view. The part of the second spiral portion 29 that forms its inner circumferential edge defines a second inner region 67 that is in an elliptical shape as seen in a plan view in the embodiment. The second inner region 67 in the second spiral portion 29 faces the first inner region 66 in the first spiral portion 26 in the normal direction Z.

The second spiral portion 29 can have a number of turns of 5 or more but 30 or less. The number of turns of the second spiral portion 29 relative to that of the first spiral portion 26 is adjusted according to the target value of voltage boosting. Preferably, the number of turns of the second spiral portion 29 is larger than that of the first spiral portion 26. Needless to say, the number of turns of the second spiral portion 29 can be smaller than or equal to that of the first spiral portion 26.

The second spiral portion 29 can have a width of 0.1 μm or more but 5 μm or less. Preferably, the second spiral portion 29 has a width of 1 μm or more but 3 μm or less. The width of the second spiral portion 29 is defined by its width in the direction orthogonal to the spiraling direction. Preferably, the width of the second spiral portion 29 is equal to the width of the first spiral portion 26.

The second spiral portion 29 can have a second winding pitch of 0.1 μm or more but 5 μm or less. Preferably, the second winding pitch is 1 μm or more but 3 μm or less. The second winding pitch is defined by the distance between two parts of the second spiral portion 29 that are adjacent to each other in the direction orthogonal to the spiraling direction. Preferably, the second winding pitch is equal to the first winding pitch of the first spiral portion 26.

The second spiral portion 29 can have any winding shape and the second inner region 67 can have any planar shape, which are thus not limited to those shown in FIG. 6 etc. The second spiral portion 29 can be wound in a polygonal shape, such as a triangular or quadrangular shape, or in a circular shape as seen in a plan view. The second inner region 67 can be defined, so as to fit the winding shape of the second spiral portion 29, in a polygonal shape, such as a triangular or quadrangular shape, or in a circular shape as seen in a plan view.

Preferably, the high-potential coil 23 is formed of the same conductive material as the low-potential coil 22. That is, preferably, like the low-potential coil 22, the high-potential coil 23 includes a barrier layer and a body layer.

Referring to FIG. 4, the semiconductor device 5 includes a plurality of (in the diagram, twelve) low-potential terminals 11 and a plurality of (in the diagram, twelve) high-potential terminals 12. The plurality of low-potential terminals 11 are electrically connected to the low-potential coils 22 of the corresponding transformers 21A to 21D respectively. The plurality of high-potential terminals 12 are electrically connected to the high-potential coils 23 of the corresponding transformers 21A to 21D respectively.

The plurality of low-potential terminals 11 are formed on the insulation principal surface 52 of the insulation layer 51. Specifically, the plurality of low-potential terminals 11 are formed in a second insulation side wall 53B side region, at an interval from the plurality of transformers 21A to 21D in the second direction Y, and are arrayed at intervals from each other in the first direction X.

The plurality of low-potential terminals 11 include a first low-potential terminal 11A, a second low-potential terminal 11B, a third low-potential terminal 11C, a fourth low-potential terminal 11D, a fifth low-potential terminal 11E, and a sixth low-potential terminal 11F. Actually, in the embodiment, two each of the plurality of low-potential terminals 11A to 11F are formed. The plurality of low-potential terminals 11A to 11F may each include any number of terminals.

The first low-potential terminal 11A faces the first transformer 21A in the second direction Y as seen in a plan view. The second low-potential terminal 11B faces the second transformer 21B in the second direction Y as seen in a plan view. The third low-potential terminal 11C faces the third transformer 21C in the second direction Y as seen in a plan view. The fourth low-potential terminal 11D faces the fourth transformer 21D in the second direction Y as seen in a plan view. The fifth low-potential terminal 11E is formed in a region between the first and second low-potential terminals 11A and 11B as seen in a plan view. The sixth low-potential terminal 11F is formed in a region between the third and fourth low-potential terminals 11C and 11D as seen in a plan view.

The first low-potential terminal 11A is electrically connected to the first inner end 24 of the first transformer 21A (low-potential coil 22). The second low-potential terminal 11B is electrically connected to the first inner end 24 of the second transformer 21B (low-potential coil 22). The third low-potential terminal 11C is electrically connected to the first inner end 24 of the third transformer 21C (low-potential coil 22). The fourth low-potential terminal 11D is electrically connected to the first inner end 24 of the fourth transformer 21D (low-potential coil 22).

The fifth low-potential terminal 11E is electrically connected to the first outer end 25 of the first transformer 21A (low-potential coil 22) and to the first outer end 25 of the second transformer 21B (low-potential coil 22). The sixth low-potential terminal 11F is electrically connected to the first outer end 25 of the third transformer 21C (low-potential coil 22) and to the first outer end 25 of the fourth transformer 21D (low-potential coil 22).

The plurality of high-potential terminals 12 are formed on the insulation principal surface 52 of the insulation layer 51, at an interval from the plurality of low-potential terminals 11. Specifically, the plurality of high-potential terminals 12 are formed in a first insulation side wall 53A side region, at an interval from the plurality of low-potential terminals 11 in the second direction Y, and are arrayed at intervals from each other in the first direction X.

The plurality of high-potential terminals 12 are formed in regions close to the corresponding transformers 21A to 21D, respectively, as seen in a plan view. The high-potential terminals 12 being close to the transformers 21A to 21D means that, as seen in a plan view; the distance between the high-potential terminals 12 and the transformers 21 is smaller than the distance between the low-potential terminals 11 and the high-potential terminals 12.

Specifically, as seen in a plan view, the plurality of high-potential terminals 12 are formed at intervals from each other along the first direction X so as to face the plurality of transformers 21A to 21D along the first direction X. More specifically, as seen in a plan view, the plurality of high-potential terminals 12 are formed at intervals from each other along the first direction X so as to be located in the second inner regions 67 in the high-potential coils 23 and in regions between adjacent high-potential coils 23. As a result, as seen in a plan view; the plurality of high-potential terminals 12 are, along with the transformers 21A to 21D, arrayed in one row along the first direction X.

The plurality of high-potential terminals 12 include a first high-potential terminal 12A, a second high-potential terminal 12B, a third high-potential terminal 12C, a fourth high-potential terminal 12D, a fifth high-potential terminal 12E, and a sixth high-potential terminal 12F. Actually, in the embodiment, two each of the plurality of high-potential terminals 12A to 12F are formed. The plurality of high-potential terminals 12A to 12F may each include any number of terminals.

The first high-potential terminal 12A is formed in the second inner region 67 in the first transformer 21A (high-potential coil 23) as seen in a plan view. The second high-potential terminal 12B is formed in the second inner region 67 in the second transformer 21B (high-potential coil 23) as seen in a plan view. The third high-potential terminal 12C is formed in the second inner region 67 in the third transformer 21C (high-potential coil 23) as seen in a plan view. The fourth high-potential terminal 12D is formed in the second inner region 67 in the fourth transformer 21D (high-potential coil 23) as seen in a plan view. The fifth high-potential terminal 12E is formed in a region between the first and second transformers 21A and 21B as seen in a plan view. The sixth high-potential terminal 12F is formed in a region between the third and fourth transformers 21C and 21D as seen in a plan view.

The first high-potential terminal 12A is electrically connected to the second inner end 27 of the first transformer 21A (high-potential coil 23). The second high-potential terminal 12B is electrically connected to the second inner end 27 of the second transformer 21B (high-potential coil 23). The third high-potential terminal 12C is electrically connected to the second inner end 27 of the third transformer 21C (high-potential coil 23). The fourth high-potential terminal 12D is electrically connected to the second inner end 27 of the fourth transformer 21D (high-potential coil 23).

The fifth high-potential terminal 12E is electrically connected to the second outer end 28 of the first transformer 21A (high-potential coil 23) and to the second outer end 28 of the second transformer 21B (high-potential coil 23). The sixth high-potential terminal 12F is electrically connected to the second outer end 28 of the third transformer 21C (high-potential coil 23) and to the second outer end 28 of the fourth transformer 21D (high-potential coil 23).

Referring to FIGS. 5 and 7, the semiconductor device 5 includes a first low-potential wiring 31, a second low-potential wiring 32, a first high-potential wiring 33, and a second high-potential wiring 34, all formed in the insulation layer 51. Actually, in the embodiment, a plurality of first low-potential wirings 31, a plurality of second low-potential wirings 32, a plurality of first high-potential wirings 33, and a plurality of second high-potential wirings 34 are formed.

The first and second low-potential wirings 31 and 32 hold the low-potential coils 22 of the first and second transformers 21A and 21B at equal potentials. The first and second low-potential wirings 31 and 32 also hold the low-potential coils 22 of the third and fourth transformers 21C and 21D at equal potentials. In the embodiment, the first and second low-potential wirings 31 and 32 hold the low-potential coils 22 of all the transformers 21A to 21D at equal potentials.

The first and second high-potential wirings 33 and 34 hold the high-potential coils 23 of the first and second transformers 21A and 21B at equal potentials. The first and second high-potential wirings 33 and 34 also hold the high-potential coils 23 of the third and fourth transformers 21C and 21D at equal potentials. In the embodiment, the first and second high-potential wirings 33 and 34 hold the high-potential coils 23 of all the transformers 21A to 21D at equal potentials.

The plurality of first low-potential wirings 31 are electrically connected respectively to the corresponding low-potential terminals 11A to 11D and to the first inner ends 24 of the corresponding transformers 21A to 21D (low-potential coils 22). The plurality of first low-potential wirings 31 have similar structures. In the following description, the structure of the first low-potential wiring 31 connected to the first low-potential terminal 11A and to the first transformer 21A will be described as an example. No separate description will be given of the structures of the other first low-potential wirings 31, to which the description of the structure of the first low-potential wiring 31 connected to the first transformer 21A is to be taken to apply.

The first low-potential wiring 31 includes a through wiring 71, a low-potential connection wiring 72, a lead wiring 73, a first connection plug electrode 74, a second connection plug electrode 75, one or a plurality of (in this embodiment, a plurality of) pad plug electrodes 76, and one or a plurality of (in this embodiment, a plurality of) substrate plug electrodes 77.

Preferably, the through wiring 71, the low-potential connection wiring 72, the lead wiring 73, the first connection plug electrode 74, the second connection plug electrode 75, the pad plug electrodes 76, and the substrate plug electrodes 77 are formed of the same conductive material as the low-potential coil 22 and the like. That is, preferably, like the low-potential coil 22 and the like, the through wiring 71, the low-potential connection wiring 72, the lead wiring 73, the first connection plug electrode 74, the second connection plug electrode 75, the pad plug electrodes 76, and the substrate plug electrodes 77 each include a barrier layer and a body layer.

The through wiring 71 penetrates a plurality of interlayer insulation layers 57 in the insulation layer 51 and extends in a columnar shape along the normal direction Z. In the embodiment, the through wiring 71 is formed in a region between the bottom and top insulation layers 55 and 56 in the insulation layer 51. The through wiring 71 has a top end part at the top insulation layer 56 side and a bottom end part at the bottom insulation layer 55 side. The top end part of the through wiring 71 is formed in the same interlayer insulation layer 57 as the high-potential coil 23, and is covered by the top insulation layer 56. The bottom end part of the through wiring 71 is formed in the same interlayer insulation layer 57 as the low-potential coil 22.

In the embodiment, the through wiring 71 includes a first electrode layer 78, a second electrode layer 79, and a plurality of wiring plug electrodes 80. In the through wiring 71, the first and second electrode layers 78 and 79 and the wiring plug electrodes 80 are formed of the same conductive material as the low-potential coil 22 and the like. That is, like the low-potential coil 22 and the like, the first and second electrode layers 78 and 79 and the wiring plug electrodes 80 each include a barrier layer and a body layer.

The first electrode layer 78 constitutes the top end part of the through wiring 71. The second electrode layer 79 constitutes the bottom end part of the through wiring 71. The first electrode layer 78 is formed as an island, and faces the low-potential terminal 11 (first low-potential terminal 11A) in the normal direction Z. The second electrode layer 79 is formed as an island, and faces the first electrode layer 78 in the normal direction Z.

The plurality of wiring plug electrodes 80 are embedded respectively in the plurality of interlayer insulation layers 57 located in a region between the first and second electrode layers 78 and 79. The plurality of wiring plug electrodes 80 are stacked together from the bottom insulation layer 55 to the top insulation layer 56 so as to be electrically connected together, and electrically connect together the first and second electrode layers 78 and 79. The plurality of wiring plug electrodes 80 each have a plane area smaller than the plane area of either of the first and second electrode layers 78 and 79.

The number of layers stacked in the plurality of wiring plug electrodes 80 is equal to the number of layers stacked in the plurality of interlayer insulation layer 57. In the embodiment, six wiring plug electrodes 80 are embedded in interlayer insulation layers 57 respectively, and any number of wiring plug electrodes 80 can be embedded in interlayer insulation layers 57 respectively. Needless to say, one or a plurality of wiring plug electrodes 80 can be formed that penetrates a plurality of interlayer insulation layers 57.

The low-potential connection wiring 72 is formed in the same interlayer insulation layer 57 as the low-potential coil 22, in the first inner region 66 in the first transformer 21A (low-potential coil 22). The low-potential connection wiring 72 is formed as an island, and faces the high-potential terminal 12 (first high-potential terminal 12A) in the normal direction Z. Preferably, the low-potential connection wiring 72 has a plane area larger than the plane area of the wiring plug electrode 80. The low-potential connection wiring 72 is electrically connected to the first inner end 24 of the low-potential coil 22.

The lead wiring 73 is formed in the interlayer insulation layer 57, in a region between the semiconductor chip 41 and the through wiring 71. In the embodiment, the lead wiring 73 is formed in the first interlayer insulation layer 57 as counted from the bottom insulation layer 55. The lead wiring 73 has a first end part at one side, a second end part at the other side, and a wiring part that connects together the first and second end parts. The first end part of the lead wiring 73 is located in a region between the semiconductor chip 41 and the bottom end part of the through wiring 71. The second end part of the lead wiring 73 is located in a region between the semiconductor chip 41 and the low-potential connection wiring 72. The wiring part extends along the first principal surface 42 of the semiconductor chip 41, and extends in the shape of a stripe in a region between the first and second end parts.

The first connection plug electrode 74 is formed in the interlayer insulation layer 57, in a region between the through wiring 71 and the lead wiring 73, and is electrically connected to the through wiring 71 and to the first end part of the lead wiring 73. The second connection plug electrode 75 is formed in the interlayer insulation layer 57, in a region between the low-potential connection wiring 72 and the lead wiring 73, and is electrically connected to the low-potential connection wiring 72 and to the second end part of the lead wiring 73.

The plurality of pad plug electrodes 76 are formed in the top insulation layer 56, in a region between the low-potential terminal 11 (first low-potential terminal 11A) and the through wiring 71, and are electrically connected to the low-potential terminal 11 and to the top end part of the through wiring 71. The plurality of substrate plug electrodes 77 are formed in the bottom insulation layer 55, in a region between the semiconductor chip 41 and the lead wiring 73. In the embodiment, the substrate plug electrodes 77 are formed in a region between the semiconductor chip 41 and the first end part of the lead wiring 73, and are electrically connected to the semiconductor chip 41 and to the first end part of the lead wiring 73.

Referring to FIGS. 6 and 7, the plurality of first high-potential wirings 33 are connected respectively to the corresponding high-potential terminals 12A to 12D and to the second inner ends 27 of the corresponding transformers 21A to 21D (high-potential coils 23). The plurality of first high-potential wirings 33 have similar structures. In the following description, the structure of the first high-potential wiring 33 connected to the first high-potential terminal 12A and to the first transformer 21A will be described as an example. No description will be given of the structures of the other first high-potential wirings 33, to which the description of the structure of the first high-potential wiring 33 connected to the first transformer 21A is to be taken to apply.

The first high-potential wiring 33 includes a high-potential connection wiring 81 and one or a plurality of (in this embodiment, a plurality of) pad plug electrodes 82. Preferably, the high-potential connection wiring 81 and the pad plug electrodes 82 are formed of the same conductive material as the low-potential coil 22 and the like. That is, preferably, like the low-potential coil 22 and the like, the high-potential connection wiring 81 and the pad plug electrodes 82 each include a barrier layer and a body layer. The high-potential connection wiring 81 is formed in the same interlayer insulation layer 57 as the high-potential coil 23, in the second inner region 67 in the high-potential coil 23. The high-potential connection wiring 81 is formed as an island, and faces the high-potential terminal 12 (first high-potential terminal 12A) in the normal direction Z. The high-potential connection wiring 81 is electrically connected to the second inner end 27 of the high-potential coil 23. The high-potential connection wiring 81 is formed at an interval from the low-potential connection wiring 72 as seen in a plan view, and does not face the low-potential connection wiring 72 in the normal direction Z. This results in an increased insulation distance between the low- and high-potential connection wirings 72 and 81 and hence an increased dielectric strength voltage in the insulation layer 51.

The plurality of pad plug electrodes 82 are formed in the top insulation layer 56, in a region between the high-potential terminal 12 (first high-potential terminal 12A) and the high-potential connection wiring 81, and are electrically connected to the high-potential terminal 12 and to the high-potential connection wiring 81. The plurality of pad plug electrodes 82 each have a plane area smaller than the plane area of the high-potential connection wiring 81 as seen in a plan view.

Referring to FIG. 7, preferably, the distance D1 between the low- and high-potential terminals 11 and 12 is larger than the distance D2 between the low- and high-potential coils 22 and 23 (D2<D1). Preferably, the distance D1 is larger than the total thickness DT of the plurality of interlayer insulation layers 57 (DT<D1). The ratio D2/D1 of the distance D2 to the distance D1 can be 0.01 or more but 0.1 or less. Preferably, the distance D1 is 100 μm or more but 500 μm or less. The distance D2 can be 1 μm or more but 5 μm or less. Preferably, the distance D2 is 5 μm or more but 25 μm or less. The distances D1 and D2 can have any values, which are adjusted appropriately according to the desired dielectric strength voltage.

Referring to FIGS. 6 and 7, the semiconductor device 5 has a dummy pattern 85 that is embedded in the insulation layer 51 so as to be located around the transformers 21A to 21D as seen in a plan view.

The dummy pattern 85 is formed in a pattern different (discontinuous) from that of either of the high- and low-potential coils 23 and 22, and is independent of the transformers 21A to 21D. That is, the dummy pattern 85 does not function as part of the transformers 21A to 21D. The dummy pattern 85 is formed as a shield conductor layer that shields electric fields between the low- and high-potential coils 22 and 23 in the transformers 21A to 21D to suppress electric field concentration on the high-potential coil 23. In the embodiment, the dummy pattern 85 is patterned at a line density per unit area that is equal to the line density of the high-potential coil 23. The line density of the dummy pattern 85 being equal to the line density of the high-potential coil 23 means that the line density of the dummy pattern 85 falls within the range of ±20% of the line density of the high-potential coil 23.

The dummy pattern 85 can be formed at any depth in the insulation layer 51, which is adjusted according to the electric field strength to be attenuated. Preferably, the dummy pattern 85 is formed in a region closer to the high-potential coil 23 than to the low-potential coil 22 with respect to the normal direction Z. The dummy pattern 85 being closer to the high-potential coil 23 with respect to the normal direction Z means that, with respect to the normal direction Z, the distance between the dummy pattern 85 and the high-potential coil 23 is smaller than the distance between the dummy pattern 85 and the low-potential coil 22.

In that way, electric field concentration on the high-potential coil 23 can be suppressed properly. The smaller the distance between the dummy pattern 85 and the high-potential coil 23 with respect to the normal direction Z, the more effectively electric field concentration on the high-potential coil 23 can be suppressed. Preferably, the dummy pattern 85 is formed in the same interlayer insulation layer 57 as the high-potential coil 23. In that way, electric field concentration on the high-potential coil 23 can be suppressed more properly. The dummy pattern 85 includes a plurality of dummy patterns that are in varying electrical states. The dummy pattern 85 can include a high-potential dummy pattern.

The high-potential dummy pattern 86 can be formed at any depth in the insulation layer 51, which is adjusted according to the electric field strength to be attenuated. Preferably, the high-potential dummy pattern 86 is formed in a region closer to the high-potential coil 23 than to the low-potential coil 22 with respect to the normal direction Z. The high-potential dummy pattern 86 being closer to the high-potential coil 23 with respect to the normal direction Z means that, with respect to the normal direction Z, the distance between the high-potential dummy pattern 86 and the high-potential coil 23 is smaller than the distance between the high-potential dummy pattern 86 and the low-potential coil 22.

The dummy pattern 85 includes a floating dummy pattern that is formed in an electrically floating state in the insulation layer 51 so as to be located around the transformers 21A to 21D.

In the embodiment, the floating dummy pattern is patterned in dense lines so as to partly cover and partly expose a region around the high-potential coil 23 as seen in a plan view. The floating dummy pattern can be formed so as to have ends or no ends.

The floating dummy pattern can be formed at any depth in the insulation layer 51, which is adjusted according to the electric field strength to be attenuated.

Any number of floating lines can be provided, which is adjusted according to the electric field strength to be attenuated. The floating dummy pattern can include a plurality of floating dummy patterns.

Referring to FIG. 7, the semiconductor device 5 includes a second functional device 60 that is formed in the first principal surface 42 of the semiconductor chip 41 in a device region 62. The second functional device 60 is formed using a superficial part of the first principal surface 42 and/or a region on the first principal surface 42 of the semiconductor chip 41, and is covered by the insulation layer 51 (bottom insulation layer 55). In FIG. 7, the second functional device 60 is shown in a simplified form by broken lines indicated in a superficial part of the first principal surface 42.

The second functional device 60 is electrically connected to a low-potential terminal 11 via a low-potential wiring, and is electrically connected to a high-potential terminal 12 via a high-potential wiring. Except that the low-potential wiring is patterned in the insulation layer 51 so as to be connected to the second functional device 60, it has a similar structure to the first low-potential wiring 31 (second low-potential wiring 32). Except that the high-potential wiring is patterned in the insulation layer 51 so as to be connected to the second functional device 60, it has a similar structure to the first high-potential wiring 33 (second high-potential wiring 34). No description will be given of the low- and high-potential wirings associated with the second functional device 60.

The second functional device 60 can include at least one of a passive device, a semiconductor rectification device, and a semiconductor switching device. The second functional device 60 can include a circuit network comprising a selective combination of any two or more of a passive device, a semiconductor rectification device, and a semiconductor switching device. The circuit network can constitute part or the whole of an integrated circuit.

The passive device can include a semiconductor passive device. The passive device can include one or both of a resistor and a capacitor. The semiconductor rectification device can include at least one of a pn-junction diode, a PIN diode, a Zener diode, a Schottky barrier diode, and a fast-recovery diode. The semiconductor switching device can include at least one of a BJT (bipolar junction transistor), a MISFET (metal-insulator-semiconductor field-effect transistor), an IGBT (insulated-gate bipolar junction transistor), and a JFET (junction field-effect transistor).

Referring to FIGS. 5 to 7, the semiconductor device 5 further includes a sealing conductor 61 embedded in the insulation layer 51. The sealing conductor 61 is embedded in the form of walls in the insulation layer 51, at intervals from the insulation side walls 53A to 53D as seen in a plan view, and partitions the insulation layer 51 into the device region 62 and an outer region 63. The sealing conductor 61 prevents moisture entry and crack development from the outer region 63 to the device region 62.

The device region 62 is a region that includes the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. The outer region 63 is a region outside the device region 62.

The sealing conductor 61 is electrically isolated from the device region 62. Specifically, the sealing conductor 61 is electrically isolated from the first functional device 45 (plurality of transformers 21), the second functional device 60, the plurality of low-potential terminals 11, the plurality of high-potential terminals 12, the first low-potential wirings 31, the second low-potential wirings 32, the first high-potential wirings 33, the second high-potential wirings 34, and the dummy pattern 85. More specifically, the sealing conductor 61 is held in an electrically floating state. The sealing conductor 61 does not form a current path connected to the device region 62.

The sealing conductor 61 is formed in the shape of a stripe along the insulation side walls 53A to 53D. In the embodiment, the sealing conductor 61 is formed in a quadrangular ring shape (specifically, a rectangular ring shape) as seen in a plan view. Thus, the sealing conductor 61 defines the outer region 63 in a quadrangular ring shape (specifically, a rectangular ring shape) surrounding the device region 62 as seen in a plan view.

Specifically, the sealing conductor 61 has a top end part at the insulation principal surface 52 side, a bottom end part at the semiconductor chip 41 side, and a wall part that extends in the form of walls between the top and bottom end parts. In the embodiment, the top end part of the sealing conductor 61 is formed at an interval from the insulation principal surface 52 toward the semiconductor chip 41, and is located in the insulation layer 51. In the embodiment, the top end part of the sealing conductor 61 is covered by the top insulation layer 56. The top end part of the sealing conductor 61 can be covered by one or a plurality of interlayer insulation layers 57. The top end part of the sealing conductor 61 can be exposed through the top insulation layer 56. The bottom end part of the sealing conductor 61 is formed at an interval from the semiconductor chip 41 toward the top end part.

Thus, in the embodiment, the sealing conductor 61 is embedded in the insulation layer 51 so as to be located at the semiconductor chip 41 side of the plurality of low-potential terminals 11 and the plurality of high-potential terminals 12. Moreover, in the insulation layer 51, the sealing conductor 61 faces, in the direction parallel to the insulation principal surface 52, the first functional device 45 (plurality of transformers 21), the first low-potential wirings 31, the second low-potential wirings 32, the first high-potential wirings 33, the second high-potential wirings 34, and the dummy pattern 85. In the insulation layer 51, the sealing conductor 61 can face, in the direction parallel to the insulation principal surface 52, part of the second functional device 60.

The sealing conductor 61 includes a plurality of sealing plug conductors 64 and one or a plurality of (in the embodiment, a plurality of) sealing via conductors 65. Any number of sealing via conductors 65 may be provided. Of the plurality of sealing plug conductors 64, the top sealing plug conductor 64 constitutes the top end part of the sealing conductor 61. The plurality of sealing via conductors 65 constitute the bottom end part of the sealing conductor 61. Preferably, the sealing plug conductors 64 and the sealing via conductors 65 are formed of the same conductive material as the low-potential coil 22. That is, preferably, like the low-potential coil 22 and the like, the sealing plug conductors 64 and the sealing via conductors 65 each include a barrier layer and a body layer.

The plurality of sealing plug conductors 64 are embedded in the plurality of interlayer insulation layers 57 respectively, and are each formed in a quadrangular ring shape (specifically, a rectangular ring shape) surrounding the device region 62. The plurality of sealing plug conductors 64 are stacked together from the bottom insulation layer 55 to the top insulation layer 56 so as to be connected together. The number of layers stacked in the plurality of sealing plug conductors 64 is equal to the number of layers in the plurality of interlayer insulation layers 57. Needless to say, one or a plurality of sealing plug conductors 64 may be formed that penetrates a plurality of interlayer insulation layers 57.

So long as a set of a plurality of sealing plug conductor 64 constitutes one ring-shaped sealing conductor 61, not all the sealing plug conductors 64 need be formed in a ring shape. For example, at least one of the plurality of sealing plug conductors 64 can be formed so as to have ends. Or at least one of the plurality of sealing plug conductors 64 may be divided into a plurality of strip-shaped portions with ends. However, with consideration given to the risk of moisture entry and crack development into the device region 62, preferably, the plurality of sealing plug conductors 64 are formed so as to have no ends (in a ring shape).

The plurality of sealing via conductors 65 are formed in the bottom insulation layer 55, in a region between the semiconductor chip 41 and the sealing plug conductors 64. The plurality of sealing via conductors 65 are formed at an interval from the semiconductor chip 41, and are connected to the sealing plug conductors 64. The plurality of sealing via conductors 65 have a plane area smaller than the plane area of the sealing plug conductors 64. In a case where a single sealing via conductor 65 is formed, the single sealing via conductors 65 can have a plane area larger than the plane area of the sealing plug conductors 64.

The sealing conductor 61 can have a width of 0.1 μm or more but 10 μm or less. Preferably, the sealing conductor 61 has a width of 1 μm or more but 5 μm or less. The width of the sealing conductor 61 is defined by its width in the direction orthogonal to the direction in which it extends.

Figure 8:
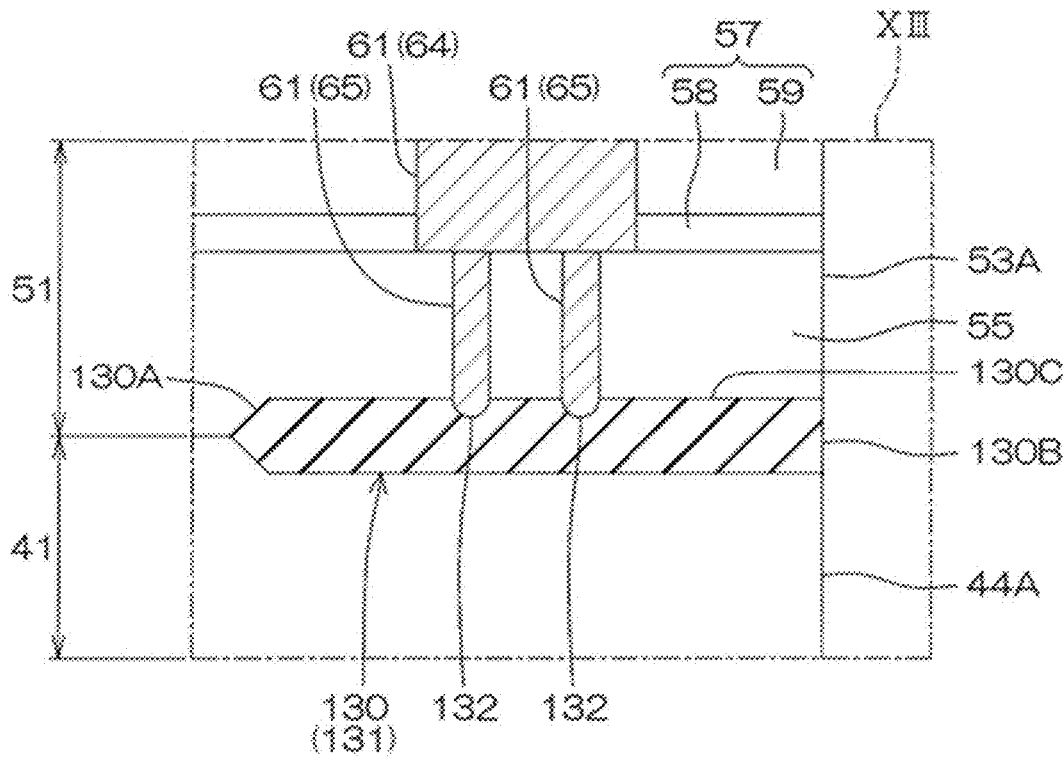
FIG. 8 is an enlarged view (showing a separation structure) of region XIII shown in FIG. 7.

Referring to FIGS. 7 and 8, the semiconductor device 5 further includes a separation structure 130 that is interposed between the semiconductor chip 41 and the sealing conductor 61 and that electrically isolates the sealing conductor 61 from the semiconductor chip 41. Preferably, the separation structure 130 includes an insulator. In the embodiment, the separation structure 130 is a field insulation film 131 formed on the first principal surface 42 of the semiconductor chip 41.

The field insulation film 131 includes at least one of an oxide film (silicon oxide film) and a nitride film (silicon nitride film). Preferably, the field insulation film 131 is a LOCOS (local oxidation of silicon) film as one example of an oxide film that is formed through oxidation of the first principal surface 42 of the semiconductor chip 41. The field insulation film 131 can have any thickness so long as it can insulate between the semiconductor chip 41 and the sealing conductor 61. The field insulation film 131 can have a thickness of 0.1 μm or more but 5 μm or less.

The separation structure 130 is formed on the first principal surface 42 of the semiconductor chip 41, and extends in the shape of a stripe along the sealing conductor 61 as seen in a plan view. In the embodiment, the separation structure 130 is formed in a quadrangular ring shape (specifically, a rectangular ring shape) as seen in a plan view. The separation structure 130 has a connection portion 132 to which the bottom end part of the sealing conductor 61 (i.e., the sealing via conductors 65) is connected. The connection portion 132 can form an anchor portion into which the bottom end part of the sealing conductor 61 (i.e., the sealing via conductors 65) is anchored toward the semiconductor chip 41. Needless to say, the connection portion 132 can be formed to be flush with the principal surface of the separation structure 130.

The separation structure 130 includes an inner end part 130A at the device region 62 side, an outer end part 130B at the outer region 63 side, and a main body part 130C between the inner and outer end parts 130A and 130B. As seen in a plan view, the inner end part 130A defines the region where the second functional device 60 is formed (i.e., the device region 62). The inner end part 130A can be formed integrally with an insulation film (not illustrated) formed on the first principal surface 42 of the semiconductor chip 41.

The outer end part 130B is exposed on the chip side walls 44A to 44D of the semiconductor chip 41, and is continuous with the chip side walls 44A to 44D of the semiconductor chip 41. More specifically, the outer end part 130B is formed so as to be flush with the chip side walls 44A to 44D of the semiconductor chip 41. The outer end part 130B constitutes a polished surface between, to be flush with, the chip side walls 44A to 44D of the semiconductor chip 41 and the insulation side walls 53A to 53D of the insulation layer 51. Needless to say, an embodiment is also possible where the outer end part 130B is formed within the first principal surface 42 at intervals from the chip side walls 44A to 44D.

The main body part 130C has a flat surface that extends substantially parallel to the first principal surface 42 of the semiconductor chip 41. The main body part 130C has the connection portion 132 to which the bottom end part of the sealing conductor 61 (i.e., the sealing via conductors 65) is connected. The connection portion 132 is formed in the main body part 130C, at intervals from the inner and outer end parts 130A and 130B. The separation structure 130 can be implemented in many ways other than in the form of a field insulation film 131.

Referring to FIG. 7, the semiconductor device 5 further includes an inorganic insulation layer 140 formed on the insulation principal surface 52 of the insulation layer 51 so as to cover the sealing conductor 61. The inorganic insulation layer 140 can be called a passivation layer. The inorganic insulation layer 140 protects the insulation layer 51 and the semiconductor chip 41 from above the insulation principal surface 52.

In the embodiment, the inorganic insulation layer 140 has a stacked structure composed of a first inorganic insulation layer 141 and a second inorganic insulation layer 142. The first inorganic insulation layer 141 can contain silicon oxide. Preferably, the first inorganic insulation layer 141 contains USG (undoped silicate glass), which is undoped silicon oxide. The first inorganic insulation layer 141 can have a thickness of 50 nm or more but 5000 nm or less. The second inorganic insulation layer 142 can contain silicon nitride. The second inorganic insulation layer 142 can have a thickness of 500 nm or more but 5000 nm or less. Increasing the total thickness of the inorganic insulation layer 140 helps increase the dielectric strength voltage above the high-potential coils 23.

In a configuration where the first inorganic insulation layer 141 is made of USG and the second inorganic insulation layer 142 is made of silicon nitride, USG has the higher dielectric breakdown voltage (V/cm) than silicon nitride. In view of this, when thickening the inorganic insulation layer 140, it is preferable to form the first inorganic insulation layer 141 thicker than the second inorganic insulation layer 142.

The first inorganic insulation layer 141 can contain at least one of BPSG (boron-doped phosphor silicate glass) and PSG (phosphorus silicate glass) as examples of silicon oxide. In that case, however, since the silicon oxide contains a dopant (boron or phosphorus), for an increased dielectric strength voltage above the high-potential coils 23, it is particularly preferable to form the first inorganic insulation layer 141 of USG. Needless to say, the inorganic insulation layer 140 can have a single-layer structure composed of either the first or second inorganic insulation layer 141 or 142.

The inorganic insulation layer 140 covers the entire area of the sealing conductor 61, and has a plurality of low-potential pad openings 143 and a plurality of high-potential pad openings 144 that are formed in a region outside the sealing conductor 61. The plurality of low-potential pad openings 143 expose the plurality of low-potential terminals 11 respectively. The plurality of high-potential pad openings 144 expose the plurality of high-potential terminals 12 respectively. The inorganic insulation layer 140 can have overlap parts that overlap circumferential edge parts of the low-potential terminals 11. The inorganic insulation layer 140 can have overlap parts that overlap circumferential edge parts of the high-potential terminals 12.

The semiconductor device 5 further includes an organic insulation layer 145 that is formed on the inorganic insulation layer 140. The organic insulation layer 145 can contain photosensitive resin. The organic insulation layer 145 can contain at least one of polyimide, polyamide, and polybenzoxazole. In the embodiment, the organic insulation layer 145 contains polyimide. The organic insulation layer 145 can have a thickness of 1 μm or more but 50 μm or less.

Preferably, the organic insulation layer 145 has a thickness larger than the total thickness of the inorganic insulation layer 140. Moreover, preferably, the inorganic and organic insulation layers 140 and 145 together have a total thickness larger than the distance D2 between the low- and high-potential coils 22 and 23. In that case, preferably, the inorganic insulation layer 140 has a total thickness of 2 μm or more but 10 μm or less. Preferably, the organic insulation layer 145 has a thickness of 5 μm or more but 50 μm or less. Such structures help suppress an increase in the thicknesses of the inorganic and organic insulation layers 140 and 145 while appropriately increasing the dielectric strength voltage above the high-potential coil 23 owing to the stacked film of the inorganic and organic insulation layers 140 and 145.

The organic insulation layer 145 includes a first part 146 that covers a low-potential side region and a second part 147 that covers a high-potential side region. The first part 146 covers the sealing conductor 61 across the inorganic insulation layer 140. The first part 146 has a plurality of low-potential terminal openings 148 through which the plurality of low-potential terminals 11 (low-potential pad openings 143) are respectively exposed in a region outside the sealing conductor 61. The first part 146 can have overlapping parts that overlap circumferential edges (overlap parts) of the low-potential pad openings 143.

The second part 147 is formed at an interval from the first part 146, and exposes the inorganic insulation layer 140 between the first and second parts 146 and 147. The second part 147 has a plurality of high-potential terminal openings 149 through which the plurality of high-potential terminals 12 (high-potential pad openings 144) are respectively exposed. The second part 147 can have overlap parts that overlap circumferential edges (overlap parts) of the high-potential pad openings 144.

The second part 147 covers the transformers 21A to 21D and the dummy pattern 85 together. Specifically, the second part 147 covers the plurality of high-potential coils 23, the plurality of high-potential terminals 12, a first high-potential dummy pattern 87, a second high-potential dummy pattern 88, and a floating dummy pattern 121 together.

The present disclosure can be implemented in any other embodiments. The embodiment described above deals with an example where a first functional device 45 and a second functional device 60 are formed. An embodiment is however also possible that only has a second functional device 60, with no first functional device 45. In that case, the dummy pattern 85 may be omitted. This structure provides, with respect to the second functional device 60, effects similar to those mentioned in connection with the first embodiment (except those associated with the dummy pattern 85).

That is, in a case where a voltage is applied to the second functional device 60 via the low- and high-potential terminals 11 and 12, it is possible suppress unnecessary conduction between the high-potential terminal 12 and the sealing conductor 61. Likewise, in a case where a voltage is applied to the second functional device 60 via the low- and high-potential terminals 11 and 12, it is possible suppress unnecessary conduction between the low-potential terminal 11 and the sealing conductor 61.

The embodiment described above deals with an example where a second functional device 60 is formed. The second functional device 60 however is not essential, and can be omitted.

The embodiment described above deals with an example where a dummy pattern 85 is formed. The dummy pattern 85 however is not essential, and can be omitted.

The embodiment described above deals with an example where the first functional device 45 is of a multichannel type that includes a plurality of transformers 21. It is however also possible to employ a single-channel first functional device 45 that includes a single transformer 21.

<Transformer Layout>

Figure 9:
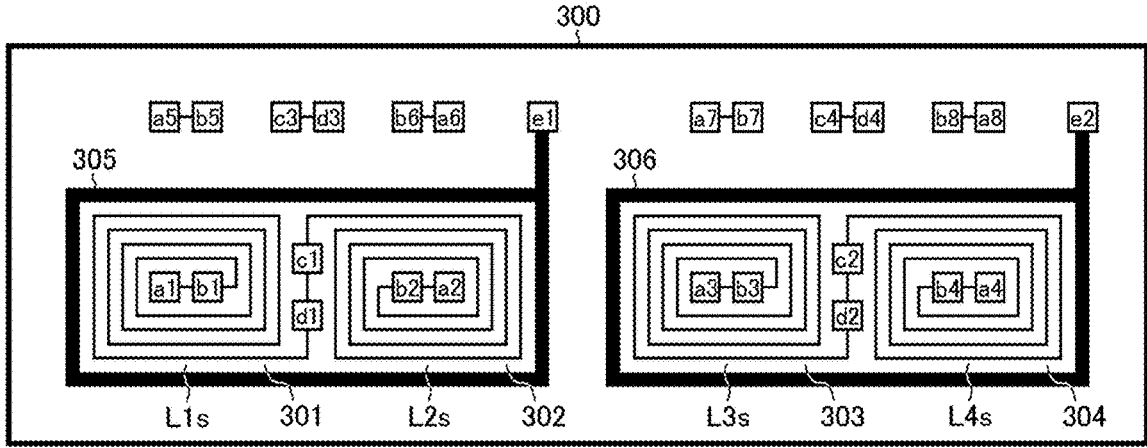
FIG. 9 is a diagram schematically showing an example of the layout of a transformer chip.

FIG. 9 is a plan view (top view) schematically showing one example of transformer layout in a two-channel transformer chip 300 (corresponding to the semiconductor device 5 described previously). The transformer chip 300 shown there includes a first transformer 301, a second transformer 302, a third transformer 303, a fourth transformer 304, a first guard ring 305, a second guard ring 306, pads a1 to a8, pads b1 to b8, pads c1 to c4, and pads d1 to d4.

In the transformer chip 300, the pads a1 and b1 are connected to one terminal of the secondary coil L1s of the first transformer 301, and the pads c1 and d1 are connected to the other terminal of that secondary coil L1s. The pads a2 and b2 are connected to one terminal of the secondary coil L2s of the second transformer 302, and the pads c1 and d1 are connected to the other terminal of that secondary coil L2s.

Moreover, the pads a3 and b3 are connected to one terminal of the secondary coil L3s of the third transformer 303, and the pads c2 and d2 are connected to the other terminal of that secondary coil L3s. The pads a4 and b4 are connected to one terminal of the secondary coil L4s of the fourth transformer 304, and the pads c2 and d2 are connected to the other terminal of that secondary coil L4s.

FIG. 9 does not show any of the primary coils of the first, second, third, and fourth transformers 301, 302, 303, and 304. The primary coils basically have structures similar to those of the secondary coils L1s to L4s respectively, and are disposed right below the secondary coils L1s to L4s, respectively, so as to face them.

Specifically, the pads a5 and b5 are connected to one terminal of the primary coil of the first transformer 301, and the pads c3 and d3 are connected to the other terminal of that primary coil. Likewise, the pads a6 and b6 are connected to one terminal of the primary coil of the second transformer 302, and the pads c3 and d3 are connected to the other terminal of that primary coil.

Likewise, the pads a7 and b7 are connected to one terminal of the primary coil of the third transformer 303, and the pads c4 and d4 are connected to the other terminal of that primary coil. Likewise, the pads a8 and b8 are connected to one terminal of the primary coil of the fourth transformer 304, and the pads c4 and d4 are connected to the other terminal of that primary coil.

The pads a5 to a8, the pads b5 to b8, the pads c3 and c4, and the pads d3 and d4 mentioned above are each led from inside the transformer chip 300 to its surface across an unillustrated via.

Of the plurality of pads mentioned above, the pads a1 to a8 each correspond to a first current feed pad, and the pads b1 to b8 each correspond to a first voltage measurement pad; the pads c1 to c4 each correspond to a second current feed pad, and the pads d1 to d4 each correspond to a second voltage measurement pad.

Thus, the transformer chip 300 of this configuration example permits, during its defect inspection, accurate measurement of the series resistance component across each coil. It is thus possible not only to reject defective products with a broken wire in a coil but also to appropriately reject defective products with an abnormal resistance value in a coil (e.g., a midway short circuit between coils), and hence to prevent defective products from being distributed in the market.

For a transformer chip 300 that has passed the defect inspection mentioned above, the plurality of pads described above can be used for connection with a primary-side chip and a secondary-side chip (e.g., the controller chip 210 and the driver chip 220 described previously).

Specifically, the pads a1 and b1, the pads a2 and b2, the pads a3 and b3, and the pads a4 and b4 can each be connected to one of the signal input and output terminals of the secondary-side chip; the pads c1 and d1 and the pads c2 and d2 can each be connected to a common voltage application terminal (GND2) of the secondary-side chip.

On the other hand, the pads a5 and b5, the pads a6 and b6, the pads a7 and b7, and the pads a8 and b8 can each be connected to one of the signal input and output terminals of the primary-side chip; the pads c3 and d3 and the pads c4 and d4 can each be connected to a common voltage application terminal (GND1) of the primary-side chip.

Here, as shown in FIG. 9, the first to fourth transformers 301 to 304 are so arranged as to be coupled for each signal transmission direction. In terms of what is shown in the diagram, for example, the first and second transformers 301 and 302, which transmit a signal from the primary-side chip to the secondary-side chip, are coupled into a first pair by the first guard ring 305. Likewise, for example, the third and fourth transformers 303 and 302, which transmit a signal from the secondary-side chip to the primary-side chip, are coupled into a second pair by the second guard ring 306.

Such coupling is intended, in a structure where the primary and secondary coils of each of the first to fourth transformers 301 to 304 are formed so as to be stacked on each other in the up-down direction of the substrate, to obtain a desired withstand voltage between the primary and secondary coils. The first and second guard rings 305 and 306 are however not essential elements.

The first and second guard rings 305 and 306 can be connected via pads e1 and e2, respectively, to a low-impedance wiring such as a grounded terminal.

In the transformer chip 300, the pads c1 and d1 are shared between the secondary coils L1$s$ and L2$s$. The pads c2 and d2 are shared between the secondary coils L3$s$ and L4$s$. The pads c3 and d3 are shared between the primary coils L1$p$ and L2$p$. The pads c4 and d4 are shared between the primary coils that correspond to them respectively. This configuration helps reduce the number of pads and helps make the transformer chip 300 compact.

Moreover, as shown in FIG. 9, the primary and secondary coils of the first to fourth transformers 301 to 304 are preferably each wound in a rectangular shape (or, with the corners rounded, in a running-track shape) as seen in a plan view of the transformer chip 300. This configuration helps increase the area over which the primary and secondary coils overlap each other and helps enhance the transmission efficiency across the transformers.

Needless to say, the illustrated transformer layout is merely an example; any number of coils of any shape can be disposed in any layout, and pads can be disposed in any layout. Any of the chip structure, transformer layouts, etc. described above can be applied to semiconductor devices in general that have a coil integrated in a semiconductor chip.

Signal Transmission Device (First Embodiment)

Figure 10:
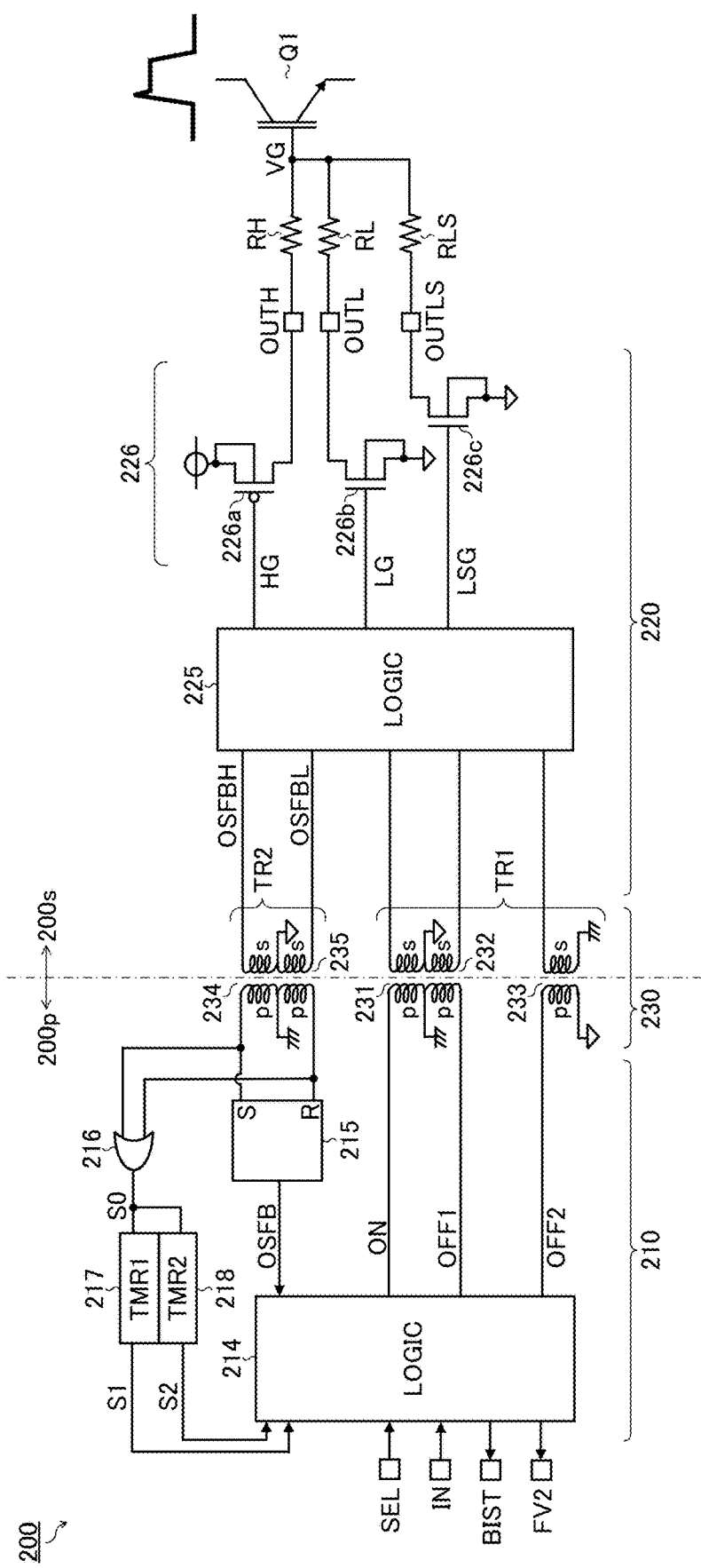
FIG. 10 is a diagram showing a signal transmission device according to a first embodiment.

FIG. 10 is a diagram showing a signal transmission device 200 according to a first embodiment. The signal transmission device 200 of the first embodiment has a basic configuration as shown in FIG. 1 and described previously, and includes, as more specific components, a first logic 214, an RS flip-flop 215, an OR gate 216, a first timer 217, a second timer 218, a second logic 225, a driver 226, a first transformer circuit TR1, and a second transformer circuit TR2.

The first logic 214 is provided in the primary circuit system 200$p$, and has a function of generating driving pulse signals (in the diagram, an on signal ON, a first off signal OFF1, and a second off signal OFF2) according to an input pulse signal IN fed in from outside the device. The on signal ON corresponds to the transmission pulse signal S11 described previously. On the other hand, the first and second off signals OFF1 and OFF2 (corresponding to a first and a second driving pulse signal) correspond to the transmission pulse signal S21 described previously.

The first logic 214 also has a function of feeding out of the device a fail signal FV2 and a self-diagnosis signal BIST according to a feedback pulse signal OSFB output from the RS flip-flop 215, a first timer signal S1 output from the first timer 217, and a second timer signal S2 output from the second timer 218.

The first logic 214 further has a function of switching the gate-off capacity (corresponding to the driving capacity for dropping a gate signal VG to low level and thereby turning off a switching device Q1) of the driver 226 according to a gate-off capacity selection signal SEL fed in from outside the device. Specifically, for example, when the gate-off capacity selection signal SEL is at low level, the first logic 214 pulse-drives the first off signal OFF1 to set the gate-off capacity of the driver 226 to a first gate-off capacity (corresponding to a first driving capacity). By contrast, for example, when the gate-off capacity selection signal SEL is at high level, the first logic 214 pulse-drives the second off signal OFF2 to set the gate-off capacity of the driver 226 to a second gate-off capacity (corresponding to a second driving capacity) higher than the first gate-off capacity.

In the following description, for an easy grasp of the magnitude relationship between the first and second gate-off capacities, these are occasionally referred to as the first gate-off capacity (low) and the second gate-off capacity (high).

The RS flip-flop 215 is provided in the primary circuit system 200$p$, and determines the logic level of the feedback pulse signal OSFB fed to the first logic 214 according to a first feedback pulse signal OSFBH and a second feedback pulse signal OSFBL fed from the second logic 225 via the second transformer circuit TR2.

For example, at the timing of pulse generation in the first feedback pulse signal OSFBH, which is fed to its set terminal(S), the RS flip-flop 215 sets the feedback pulse signal OSFB to high level and, at the timing of pulse generation in the second feedback pulse signal OSFBL, which is fed to its reset terminal (R), the RS flip-flop 215 resets the feedback pulse signal OSFB to low level.

The OR gate 216 is provided in the primary circuit system 200p, and generates an OR signal S0 between the first and second feedback pulse signals OSFBH and OSFBL fed to it from the second logic 225 via the second transformer circuit TR2. The OR signal S0 is at high level when at least one of the first and second feedback pulse signals OSFBH and OSFBL is at high level, and is at low level when the first and second feedback pulse signals OSFBH and OSFBL are both at low level.

The first timer 217 is provided in the primary circuit system 200p, and outputs the first timer signal S1 by sensing whether the OR signal S0 is being pulse-driven at a predetermined period T (e.g., T=10 μs, f=100 kHz (=1/T)). For example, the first timer signal S1 is at high level if the OR signal S0 is sensed to be pulse-driven periodically, and is at low level if the OR signal S0 is not sensed to be pulse-driven periodically.

The second timer 218 is provided in the primary circuit system 200p, and outputs the second timer signal S2 by sensing whether the number of pulses P1 per period generated in the OR signal S0 is m (e.g., m=2) or n (e.g., n=1). The second timer signal S2 is at high level if the number of pulses P1 per period is m, and is at low level if the number of pulses P1 per period is n.

The first logic 214, the RS flip-flop 215, the OR gate 216, the first timer 217, and the second timer 218 are all integrated in the controller chip 210 (corresponding to a first chip).

The second logic 225 is provided in the secondary circuit system 200s, and has a function (gate driving function) of determining the logic level of the gate signal VG fed to the gate of the switching device Q1 (e.g., an IGBT or FET) by driving the driver 226 according to the driving pulse signals (in the diagram, the on signal ON and the first and second off signals OFF1 and OFF2) fed to it from the first logic 214 via the first transformer circuit TR1. For example, the second logic 225 drives the driver 226 such that, when a pulse is generated in the on signal ON, the gate signal VG is turned to high level and that, when a pulse is generated in one of the first and second off signals OFF1 or OFF2, the gate signal VG is turned to low level.

The second logic 225 also has a function (gate-off capacity switching function) of switching the gate-off capacity of the driver 226 according to which of the first and second off signals OFF1 and OFF2 is being pulse-driven. Specifically, for example, when the first off signal OFF1 is being pulse-driven, the second logic 225 sets the gate-off capacity of the driver 226 to the first gate-off capacity (low); by contrast, for example, when the second off signal OFF2 is being pulse-driven, the second logic 225 sets the gate-off capacity of the driver 226 to the second gate-off capacity (high).

The second logic 225 further has a function (gate logic feedback function) of, at the timing that the gate signal VG turns from low level to high level, pulse-driving the first feedback pulse signal OSFBH with a number of pulses P2 (a single pulse or a plurality of pulses) and, at the timing that the gate signal VG turns from high level to low level, pulse-driving the second feedback pulse signal OSFBL with the number of pulses P2.

The second logic 225 has a function (operating state feedback function) of pulse-driving one of the first and second feedback pulse signals OSFBH and OSFBL at a predetermined period T, with the number of pulses P1 (m or n pulses) at a time (i.e., per period), if the secondary circuit system 200s (hence the driver chip 220) is in normal condition (a condition in which none of various kinds of protection operation (such as UVLO [undervoltage lockedout], ISD [thermal shut-down], OVP [overvoltage protection], OCP [overcurrent protection], and SCP [short-circuit protection]) is in effect). For example, when the gate signal VG is at high level, the second logic 225 pulse-drives the first feedback pulse signal OSFBH periodically and, when the gate signal VG is at low level, the second logic 225 pulse-drives the second feedback pulse signal OSFBL periodically.

The second logic 225 further has a function (gate-off capacity feedback function) of switching the number of pulses P1 according to the gate-off capacity of the driver 226. For example, when the gate-off capacity of the driver 226 is the first gate-off capacity (low), the second logic 225 sets the number of pulses P1 to m (e.g., m=1) and, when the gate-off capacity of the driver 226 is the second gate-off capacity (high), the second logic 225 sets the number of pulses P1 to n (e.g., m=2).

The driver 226 is provided in the secondary circuit system 200s, and generates the gate signal VG according to control signals (in the diagram, a high-side gate signal HG, a first low-side gate signal LG, and a second low-side gate signal LSG) from the second logic 225. In terms of what is shown in the diagram, the driver 226 includes a high-side driving transistor 226a (such as a PMOSFET) along with a first low-side driving transistor 226b and a second low-side transistor 226c (such as NMOSFETs).

The high-side driving transistor 226a is connected between a supply terminal and an output terminal for a high-side output pulse signal OUTH, and is turned on and off according to the high-side gate signal HG. More specifically, the high-side driving transistor 226a is on when the high-side gate signal HG is at low level, and is off when the high-side gate signal HG is at high level. The output terminal for the high-side output pulse signal OUTH is connected to the gate of the switching device Q1 via an externally connected resistor RH.

The first low-side driving transistor 226b is connected between an output terminal for a first low-side output pulse signal OUTL and a ground terminal, and is turned on and off according to the first low-side gate signal LG. More specifically, the first low-side driving transistor 226b is on when the first low-side gate signal LG is at high level, and is off when the first low-side gate signal LG is at low level. The output terminal for the first low-side output pulse signal OUTL is connected to the gate of the switching device Q1 via an externally connected resistor RL.

The second low-side driving transistor 226c is connected between an output terminal for a second low-side output pulse signal OUTLS and the ground terminal, and is turned on and off according to the second low-side gate signal LSG. More specifically, the second low-side driving transistor 226c is on when the second low-side gate signal LSG is at high level, and is off when the second low-side gate signal LSG is at low level. The output terminal for the second low-side output pulse signal OUTLS is connected to the gate of the switching device Q1 via an externally connected resistor RLS.

For example, to turn on the switching device Q1, the high-side driving transistor 226a is turned on while the first and second low-side transistors 226b and 226c are both left off. As a result, the gate signal VG turns to high level and thus the switching device Q1 turns on.

On the other hand, to turn off the switching device Q1, while the high-side driving transistor 226a is left off, at least one of the first and second low-side transistors 226b and 226c is turned on. As a result, the gate signal VG falls to low level and thus the switching device Q1 turns off.

For example, if, with the gate-off capacity selection signal SEL at low level, the input pulse signal IN is dropped to low level with the result that the first off signal OFF1 (corresponding to a first driving pulse signal) is pulse-driven, the second logic 225 turns on only the first low-side driving transistor 226b while keeping the second low-side transistor 226c off. Accordingly, only a first discharge path via the resistor RL conducts. This state corresponds to a state where the gate-off capacity of the driver 226 is the first gate-off capacity (low).

On the other hand, if, with the gate-off capacity selection signal SEL at high level, the input pulse signal IN is dropped to low level with the result that the second off signal OFF2 (corresponding to a second driving pulse signal) is pulse-driven, the second logic 225 turns on both the first and second low-side driving transistors 226b and 226c. Accordingly, the first discharge path via the resistor RL and a second discharge path via the resistor RLS both conduct. This state corresponds to a state where the gate-off capacity of the driver 226 is the second gate-off capacity (high).

The second logic 225 and the driver 226 are both integrated in the driver chip 220 (corresponding to a second chip).

The first transformer circuit TR1 includes transformers 231 to 233, and transmits the driving pulse signals (the on signal ON and the first and second off signals OFF1 and OFF2) output from the first logic 214 to the second logic 225 while isolating between the primary and secondary circuit systems 200p and 200s.

The transformer 231 outputs the on signal ON, which is fed from the first logic 214 to the primary coil 231p, from the secondary coil 231s to the second logic 225. The transformer 232 outputs the first off signal OFF1, which is fed from the first logic 214 to the primary coil 232p, from the secondary coil 232s to the second logic 225. The transformer 233 outputs the second off signal OFF2, which is fed from the first logic 214 to the primary coil 233p, from the secondary coil 233s to the second logic 225.

The second transformer circuit TR2 include transformers 234 and 235, and transmits the first and second feedback pulse signals OSFBH and OSFBL output from the second logic 225 to the first logic 214 (more precisely, to the RS flip-flop 215) while isolating between the primary and secondary circuit systems 200p and 200s.

The transformer 234 outputs the first feedback pulse signal OSFBH, which is fed to from the second logic 225 the secondary coil 234s, from the primary coil 234p to the first logic 214 (more precisely, to the set terminal(S) of the RS flip-flop 215). The transformer 235 outputs the second feedback pulse signal OSFBL, which is fed from the second logic 225 to the secondary coil 235s, from the primary coil 235p to the first logic 214 (more precisely, to the reset terminal (R) of the RS flip-flop 215).

The first and second transformer circuits TR1 and TR2 described above are both integrated in the transformer chip 230 (corresponding to a third chip). The transformer chip 230 can be a single chip, or a group of a plurality of chips. For example, the transformers 231 and 232 can be integrated into a first, two-channel, transformer chip, the transformer 233 can be integrated into a second, one-channel, transformer chip, and the transformers 234 and 235 can be integrated into a third, two-channel, transformer chip.

The signal transmission device 200 of the first embodiment, along with the switching device Q1 (in the diagram, an IGBT) driven with the gate signal VG, can be incorporated in a variety of electronic devices (such as power supply devices and motor driving devices).

Feedback Operation (First Example)

Figure 11:
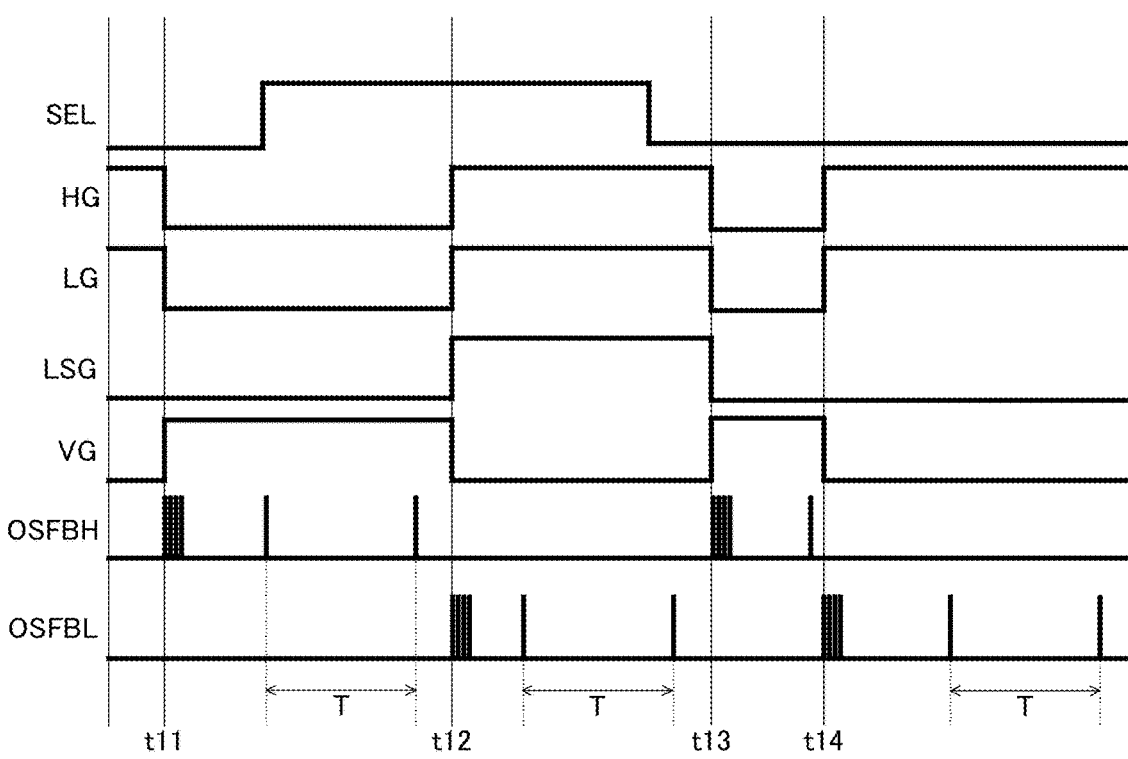
FIG. 11 is a diagram showing a first example (comparative example) of feedback operation.

FIG. 11 is a diagram showing a first example of the feedback operation by the signal transmission device 200 according to the first embodiment (an example of operation on the assumption that the second logic 225 is not provided with a gate-off capacity feedback function, for comparison with a second example (FIG. 12), which will be described later), depicting, from top down, the gate-off capacity selection signal SEL, the high-side gate signal HG, the first low-side gate signal LG, the second low-side gate signal LSG, the gate signal VG, the first feedback pulse signal OSFBH, and the second feedback pulse signal OSFBL.

The periods between times t11 and t12 and between times t13 and t14 each correspond to the on period of the switching device Q1. To turn on the switching device Q1, the high-side driving transistor 226a is turned on (HG=L) while the first and second low-side driving transistors 226b and 226c are both left off (LG=LSG=L). As a result, the gate signal VG rises to high level and thus the switching device Q1 turns on.

On the other hand, the periods before time t11, between times t12 and t13, and after time t14 each correspond to the off period of the switching device Q1. To turn off the switching device Q1, while the high-side driving transistor 226a is left off (HG=H), at least one of the first and second low-side driving transistors 226b and 226c is turned on (LG=LSG=H, or LG=H and LSG=L). As a result, the gate signal VG falls to low level and thus the switching device Q1 turns off.

Note that, at time t12 (i.e., the first off timing in the diagram), the gate-off capacity selection signal SEL is at high level. Accordingly, in the off period of the switching device Q1 between times t12 and t13, the first and second low-side gate signals LG and LSG are both at high level and thus the first and second low-side driving transistors 226b and 226c are both on. As a result, the first discharge path via the resistor RL and the second discharge path via the resistor RLS both conduct, so that the gate-off capacity of the driver 226 is the second gate-off capacity (high).

On the other hand, at time t14 (i.e., the second off timing in the diagram), the gate-off capacity selection signal SEL is at low level. Accordingly, in the off period of the switching device Q1 after time t14, only the first low-side gate signal LG is at high level and the second low-side gate signal LSG is kept at low level; thus only the first low-side driving transistor 226b is on and the second low-side transistor 226c remains off. As a result, only the first discharge path via the resistor RL conducts, so that the gate-off capacity of the driver 226 is the first gate-off capacity (low).

As described above, the signal transmission device 200 of this embodiment has a function (gate-off capacity switching function) of freely switching the gate-off capacity of the driver 226 according to the gate-off capacity selection signal SEL. Thus, by switching the gate-off capacity of the driver 226 appropriately in accordance with the specifications of the electronic device that incorporates the signal transmission device 200, it is possible to prevent, for example, an overshoot in the collector voltage of the switching device Q1 at its off transition.

Next, a description will be given of feedback functions (in particular, a gate logic feedback function and an operating state feedback function) using the first and second feedback pulse signals OSFBH and OSFBL.

First, a gate logic feedback function will be described. As observed at times t11 and t13, at the timing that the gate signal VG turns from low level to high level, the second logic 225 pulse-drives the first feedback pulse signal OSFBH with the number of pulses P2 (e.g., four pulses at 10 MHz). As observed at times t12 and t14, at the timing that the gate signal VG turns from high level to low level, the second logic 225 pulse-drives the second feedback pulse signal OSFBL with the number of pulses P2. Here the number of pulses P2 produced in each of the first and second feedback pulse signals OSFBH and OSFBL can be one (a single pulse) or more (a plurality of pulses), a plurality of pulses being preferable from the viewpoint of preventing malfunctioning due to overlaid noise.

As a result of the first and second feedback pulse signals OSFBH and OSFBL each being pulse-driven as described above, the feedback pulse signal OSFB fed from the RS flip-flop 215 to the first logic 214 turns to high level at the timing that the gate signal VG turns from low level to high level, and turns to low level at the timing that the gate signal VG turns from high level to low level. Thus the logic level of the feedback pulse signal OSFB is equivalent to the logic level of the gate signal VG.

Accordingly, the first logic 214 can, by comparing the logic levels of the input pulse signal IN and the feedback pulse signal OSFB with each other, judge whether the logic level of the gate signal VG fed to the gate of the switching device Q1 coincides with the expected value. Incidentally, if the logic level of the gate signal VG does not coincide with the expected value, it is possible, for example, to turn the fail signal FV2 to high level (a logic level indicating a fault being detected) and thereby indicate the occurrence of the fault to a microcontroller or the like outside the device.

Next, an operating state feedback function will be described. As described previously, if the secondary circuit system 200s (hence the driver chip 220) is in normal condition, the second logic 225 pulse-drives one of the first and second feedback pulse signals OSFBH and OSFBL at the period T, with one pulse at a time (i.e., per period). In terms of what is shown in the diagram, for example, when the gate signal VG is at high level, the second logic 225 pulse-drives the first feedback pulse signal OSFBH periodically, with one pulse at a time, and when the gate signal VG is at low level, the second logic 225 pulse-drives the second feedback pulse signal OSFBL periodically, with one pulse at a time.

As described above, if the secondary circuit system 200s is in normal condition and the first and second feedback pulse signals OSFBH and OSFBL are pulse-driven periodically, the first timer signal S1 fed from the first timer 217 to the first logic 214 is at low level (i.e., a logic level indicating no fault being detected). By contrast, if the secondary circuit system 200s has a fault and the first and second feedback pulse signals OSFBH and OSFBL are not pulse-driven periodically, the first timer signal S1 is at high level (i.e., a logic level indicating a fault being detected).

Thus, the first logic 214 can, by monitoring the logic level of the first timer signal S1, judge whether the secondary circuit system 200s is in normal condition. If the secondary circuit system 200s is not in normal condition, it is possible, for example, to turn the fail signal FV2 to high level (a logic level indicating a fault being detected) and thereby indicate the occurrence of the fault to a microcontroller or the like outside the device.

Note that the first example of feedback operation shown in the diagram depicts the behavior observed on the assumption that the second logic 225 does not have a gate-off capacity feedback function, for comparison with a second example (FIG. 12), which will be described later.

That is, if the secondary circuit system 200s is in normal condition, regardless of the logic level of the gate-off capacity selection signal SEL (hence the gate-off capacity of the driver 226), the second logic 225 pulse-drives one of the first and second feedback pulse signals OSFBH and OSFBL periodically, with one pulse at a time.

That is, the first and second feedback pulse signals OSFBH and OSFBL do not include information on the gate-off capacity of the driver 226. Thus, it is not possible, by monitoring the first and second feedback pulse signals OSFBH and OSFBL with the first logic 214, to know the gate-off capacity of the driver 226.

In view of the above challenge, a description will now be given of the behavior observed when the driver 226 is provided with a gate-off capacity feedback function.

Feedback Operation (Second Example)

Figure 12:
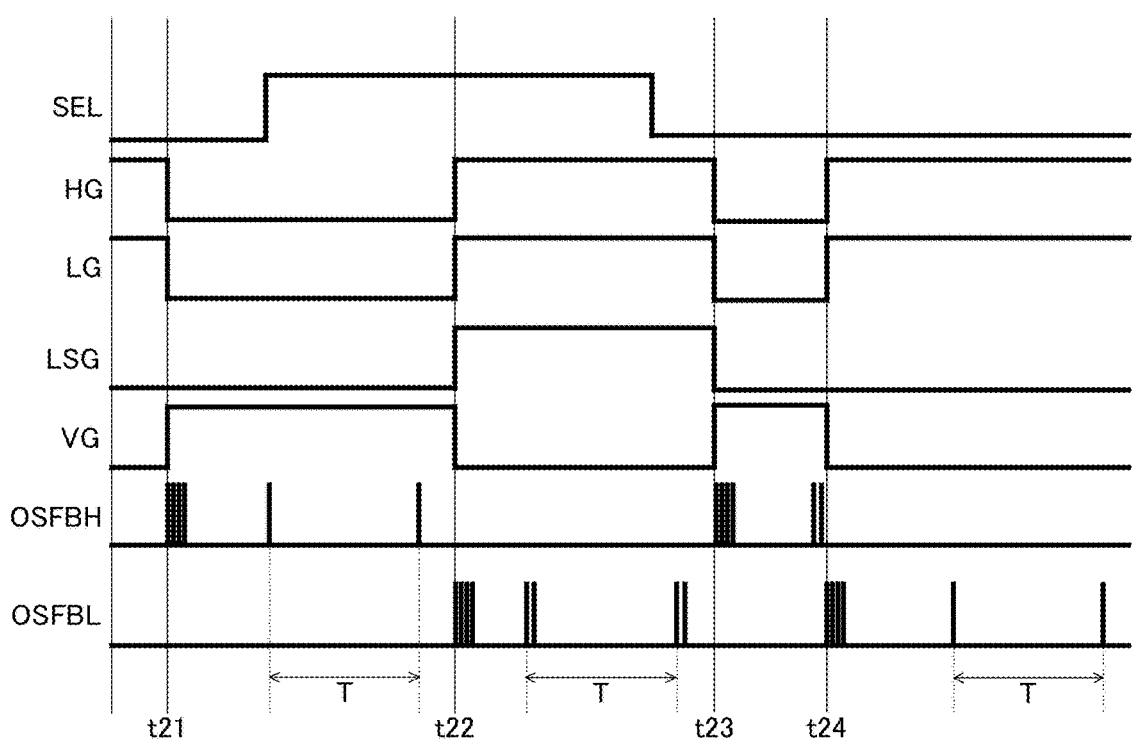
FIG. 12 is a diagram showing a second example (embodiment) of feedback operation.

FIG. 12 is a diagram showing a second example of the feedback operation by the signal transmission device 200 according to the first embodiment (an example of operation observed when the second logic 225 is provided with a gate-off capacity feedback function), depicting, from top down, the gate-off capacity selection signal SEL, the high-side gate signal HG, the first low-side gate signal LG, the second low-side gate signal LSG, the gate signal VG, the first feedback pulse signal OSFBH, and the second feedback pulse signal OSFBL.

Times t21 to t24 in the diagram correspond to times t11 to t14 in FIG. 11, and the behavior of the signals is basically the same as in the first example described previously. Accordingly, no overlapping description will be repeated for similar features as observed in FIG. 11, and the following description focuses on novel features that achieve a gate-off capacity feedback function using the first and second feedback pulse signals OSFBH and OSFBL.

As described previously, if the secondary circuit system 200s is in normal condition, the second logic 225 pulse-drives one of the first and second feedback pulse signals OSFBH and OSFBL (whichever corresponds to the logic level of the gate signal VG) at a predetermined period T.

Meanwhile, according to the gate-off capacity of the driver 226, the second logic 225 switches the number of pulses P1 per period generated in the first and second feedback pulse signals OSFBH and OSFBL.

In terms of what is shown in the diagram, as observed between times t22 and t24, if in response to the gate-off capacity selection signal SEL being at high level the gate-off capacity of the driver 226 is set to the second gate-off capacity (high), the second logic 225 makes the number of pulses P1 per period n pulses (e.g., two pulses at 10 MHz). In this case, the second timer signal S2 fed from the second timer 218 to the first logic 214 is at high level (the logic level corresponding to the gate-off capacity of the driver 226 being set to the second gate-off capacity (high)).

On the other hand, as observed before time t22 and after time t24, if in response to the gate-off capacity selection signal SEL being at low level the gate-off capacity of the driver 226 is set to the first gate-off capacity (low), the second logic 225 makes the number of pulses P1 per period m pulses (e.g., one pulse). In this case, the second timer signal S2 is at low level (i.e., the logic level corresponding to the gate-off capacity of the driver 226 being set to the first gate-off capacity (low)).

Thus the first logic 214 can, for example by comparing the logic levels of the gate-off capacity selection signal SEL and the second timer signal S2 with each other, judge whether the gate-off capacity of the driver 226 coincides with the expected value. If the gate-off capacity of the driver 226 does not coincide with the expected value, it is possible, for example, to turn the fail signal FV2 to high level (a logic level indicating a fault being detected) and thereby indicate the occurrence of the fault to a microprocessor or the like outside the device.

The first logic 214 can output the second timer signal S2 (i.e., information on the gate-off capacity of the driver 226) to the microprocessor or the like outside the device. In that case, preferably, instead of an output terminal for the second timer signal S2 being provided separately, an output terminal for the self-diagnosis signal BIST can be shared (details will be given later).

As described above, in the signal transmission device 200 of the first embodiment, the first and second feedback pulse signals OSFBH and OSFBL convey three kinds of feedback information (specifically, information on the logic level of the gate signal VG, information on whether the secondary circuit system 200s is in normal condition, and information on the gate-off capacity of the driver 226). This makes it possible to feed three kinds of information from the secondary circuit system 200s to the primary circuit system 200p with no increase in the size of the second transformer circuit TR2.

<Gate-Off Capacity Feedback Function (Summary)>

FIG. 13 is a diagram showing the states of the gate-off capacity selection signal SEL and different parts in the device (the driving pulse signal transmitted via the first transformer circuit TR1, the first and second low-side output pulse signals OUTL and OUTLS, the first and second feedback pulse signals OSFBH and OSFBL, and the self-diagnosis signal BIST).

As described above, when with the gate-off capacity selection signal SEL at high level the switching device Q1 is turned on, as the driving pulse signal transmitted via the first transformer circuit TR1, the second off signal OFF2 is pulse-driven. As a result, the first and second low-side driving transistors 226b and 226c are both turned on. Thus the first and second low-side output pulse signals OUTL and OUTLS are both dropped to low level (GND), so that the gate-off capacity of the driver 226 is set to the second gate-off capacity (high). In this state, the first and second feedback pulse signals OSFBH and OSFBL are pulse-driven periodically, with two pulses at a time; thus the second timer signal S2 is at high level, and accordingly the self-diagnosis signal BIST is at high level.

By contrast, when with the gate-off capacity selection signal SEL at low level the switching device Q1 is turned off, as the driving pulse signal transmitted via the first transformer circuit TR1, the first off signal OFF1 is pulse-driven. As a result, the first low-side driving transistor 226b is turned on, while the second low-side transistor 226c is kept off. Thus the first low-side output pulse signal OUTL is dropped to low level (GND) and the second low-side output pulse signal OUTLS is kept at a high impedance, so that the gate-off capacity of the driver 226 is set to the first gate-off capacity (low). In this state, the first and second feedback pulse signals OSFBL and OSFBL are pulse-driven periodically, with one pulse at a time; thus the second timer signal S2 is at low level, and accordingly the self-diagnosis signal BIST is at low level.

The self-diagnosis signal BIST mentioned above is intrinsically a signal for the output, to a microprocessor or the like outside the device, of a diagnosis result obtained through BIST (built-in self-test) operation in the signal transmission device 200. Accordingly, after the completion of BIST operation, the output terminal for the self-diagnosis signal BIST remains unused. Thus the output terminal for the self-diagnosis signal BIST can be shared as an output terminal for the second timer signal S2. Specifically, after the completion of BIST operation, the second timer signal S2 as it is can be output as the self-diagnosis signal BIST.

With this configuration, it is possible to output the second timer signal S2 (i.e., information on the gate-off capacity of the driver 226) to a microprocessor or the like outside the device without unnecessarily increasing the number of external terminals of the signal transmission device 200.

<Signal Transmission Operation>

Figure 14:
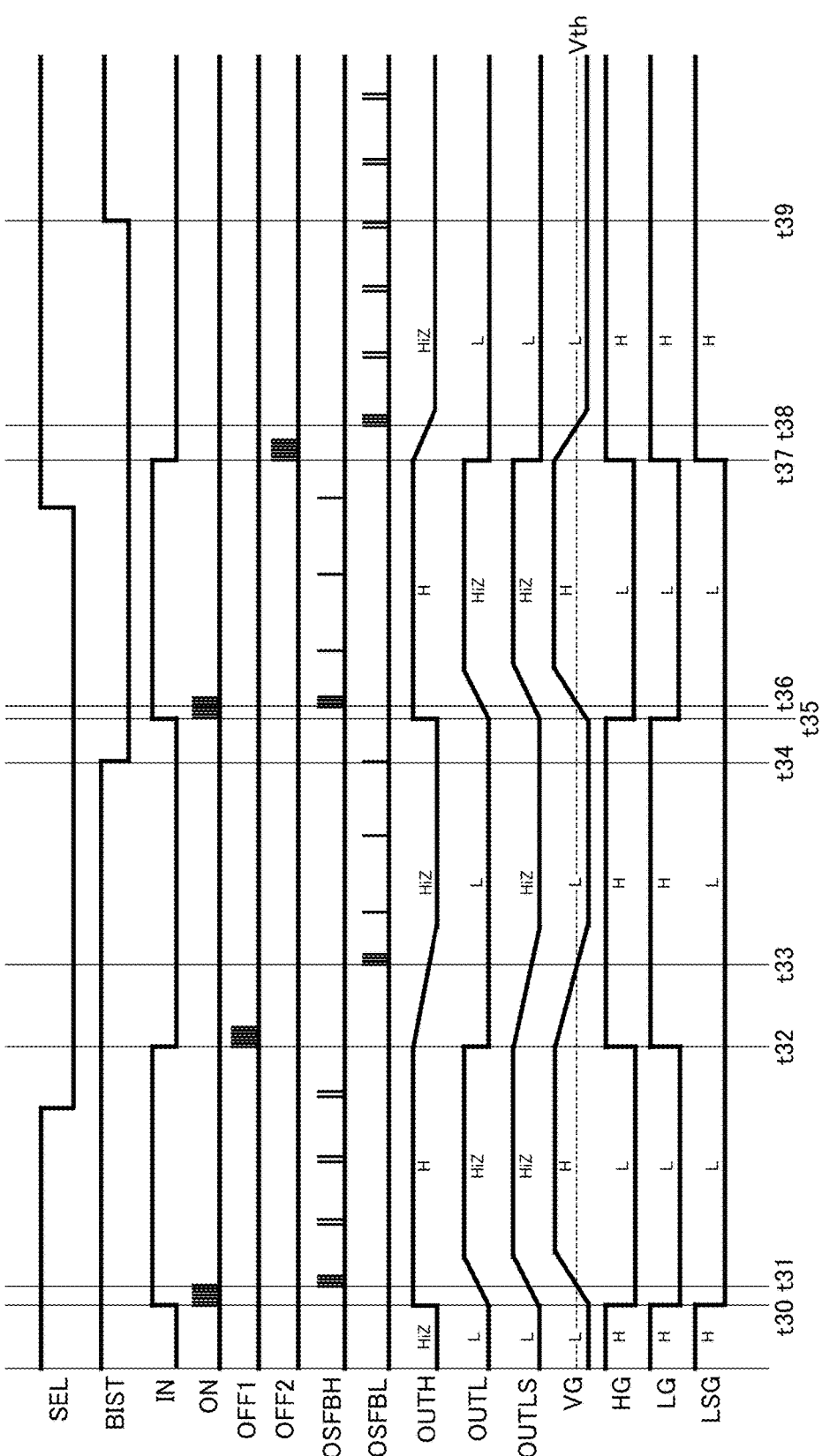
FIG. 14 is a diagram showing one example of signal transmission operation.

FIG. 14 is a diagram showing one example of signal transmission operation in the signal transmission device 200 according to the first embodiment, depicting, from top down, the gate-off capacity selection signal SEL, the self-diagnosis signal BIST, the input pulse signal IN, the on signal ON, the first off signal OFF1, the second off signal OFF2, the first feedback pulse signal OSFBH, the second feedback pulse signal OSFBL, the high-side output pulse signal OUTH, the first low-side output pulse signal OUTL, the second low-side output pulse signal OUTLS, the gate signal VG, the high-side gate signal HG, the first low-side gate signal LG, and the second low-side gate signal LSG.

When at time t30 the input pulse signal IN is raised to high level, the on signal ON is pulse-driven with a single pulse or a plurality of pulses (e.g., seven pulses). As a result, the high-side output pulse signal OUTH turns to high level and the gate signal VG rises to high level, so that the switching device Q1 turns on. At this time, the first and second low-side gate signals LG and LSG are both at low level. Accordingly, the first and second low-side output pulse signals OUTL and OUTLS both go into a high-impedance state and become equal to the high-side output pulse signal OUTH (high level).

When at time t31 the gate signal VG rises above a predetermined threshold value Vth, the first feedback pulse signal OSFBH is pulse-driven with a plurality of pulses (e.g., four pulses). Through this pulse-driving, information on the logic level of the gate signal VG (here, information that VG=H) is fed from the second logic 225 back to the first logic 214.

Between times t31 and t32, in response to the secondary circuit system 200s being in normal condition, the first feedback pulse signal OSFBH is pulse-driven periodically. Through this periodic pulse-driving, in formation on the operating state of the secondary circuit system 200s (here, information that it is in normal condition) is fed from the second logic 225 back to the first logic 214.

From before time t30, in response to the gate-off capacity selection signal SEL being at high level, the gate-off capacity of the driver 226 is set to the second gate-off capacity (high). Accordingly, the first feedback pulse signal OSFBH is pulse-driven periodically, with two pulses at a time, according to the gate-off capacity of the driver 226. Through this pulse number switching control, information on the gate-off capacity of the driver 226 (here, information that it is the second gate-off capacity (high)) is fed from the second logic 225 back to the first logic 214.

Incidentally, if the pulse-driving described above has continued for a plurality of periods (e.g., three periods), the second timer signal S2 (not illustrated) turns to high level and also the self-diagnosis signal BIST turns to high level (the logic level corresponding to the second gate-off capacity (high)). In the diagram, however, the self-diagnosis signal BIST has been at high level from before time t30, and thus the logic level of the self-diagnosis signal BIST does not change.

At time t32, with the gate-off capacity selection signal SEL at low level, the input pulse signal IN is dropped to low level. In this case, the first off signal OFF1 is pulse-driven with a single pulse or a plurality of or pulses (e.g., seven pulses). As a result, the first low-side gate signal LG is turned to high level, the first low-side output pulse signal OUTL turns to low level, and the gate signal VG falls to low level, so that the switching device Q1 turns off. At this time, the high-side gate signal HG is at high level and the second low-side gate signal LSG is at low level. Accordingly, the high-side output pulse signal OUTH and the second low-side output pulse signal OUTLS both go into a high-impedance state and falls with behavior similar to that of the gate signal VG until they eventually become equal to the first low-side output pulse signal OUTL (low level).

When at time t33 the gate signal VG falls below the predetermined threshold value Vth, the second feedback pulse signal OSFBL is pulse-driven with a plurality of pulses (e.g., four pulses). Through this pulse-driving, information on the logic level of the gate signal VG (here, information that VG=L) is fed from the second logic 225 back to the first logic 214.

Between times t33 to t34, in response to the secondary circuit system 200s being in normal condition, the second feedback pulse signal OSFBL is pulse-driven periodically. Through this periodic pulse-driving, information on the operating state of the secondary circuit system 200s (here, information that it is in normal condition) is fed from the second logic 225 back to the first logic 214.

After time t32, in response to the gate-off capacity selection signal SEL being at low level, the gate-off capacity of the driver 226 is set to the first gate-off capacity (low). Accordingly, the second feedback pulse signal OSFBL is pulse-driven periodically, one pulse at a time, according to the gate-off capacity of the driver 226. Through this pulse number switching control, information on the gate-off capacity of the driver 226 (here, information that it is the first gate-off capacity (low)) is fed from the second logic 225 back to the first logic 214.

At time t34, if the pulse-driving described above has continued for a plurality of periods (e.g., three periods), the second timer signal S2 (not illustrated) turns to low level and also the self-diagnosis signal BIST turns to low level (the logic level corresponding to the first gate-off capacity (low)).

When at time t35 the input pulse signal IN is raised to high level, the on signal ON is pulse-driven with a singe pulse or a plurality of pulses (e.g., seven pulses). As a result, the high-side output pulse signal OUTH turns to high level and the gate signal VG rises to high level, so that the switching device Q1 turns on. At this time, the first and second low-side gate signals LG and LSG are both at low level. Accordingly, the first and second low-side output pulse signals OUTL and OUTLS both go into a high-impedance state and become equal to the high-side output pulse signal OUTH (high level).

When at time t36 the gate signal VG rises above the predetermined threshold value Vth, the first feedback pulse signal OSFBH is pulse-driven with a plurality of pulses (e.g., four pulses). Through this pulse-driving, information on the logic level of the gate signal VG (here, information that VG=H) is fed from the second logic 225 back to the first logic 214.

Between times t36 and t37, in response to the secondary circuit system 200s being in normal condition, the first feedback pulse signal OSFBH is pulse-driven periodically. Through this periodic pulse-driving, information on the operating state of the secondary circuit system 200s (here, information that it is in normal condition) is fed from the second logic 225 back to the first logic 214.

After time t32 mentioned above, in response to the gate-off capacity selection signal SEL being at low level, the gate-off capacity of the driver 226 is set to the first gate-off capacity (low). Accordingly, the first feedback pulse signal OSFBH is pulse-driven periodically, with one pulse at a time, according to the gate-off capacity of the driver 226. Through this pulse number switching control, information on the gate-off capacity of the driver 226 (here, information that it is the first gate-off capacity (low)) is fed from the second logic 225 back to the first logic 214.

If the pulse-driving described above has continued for a plurality of periods (e.g., three periods), the second timer signal S2 (not illustrated) turns to low level and also the self-diagnosis signal BIST turns to low level (the logic level corresponding to the first gate-off capacity (low)). In the diagram, however, the self-diagnosis signal BIST turns as been at low level from time t34 and thus the logic level of the self-diagnosis signal BIST does not change.

At time t37, with the gate-off capacity selection signal SEL at high level, the input pulse signal IN is dropped to low level. In this case, the second off signal OFF2 is pulse-driven with a single pulse or a plurality of pulses (e.g., seven pulses). As a result, the first and second low-side gate signals LG and LSG are both turned to high level, the first and second low-side output pulse signals OUTL and OUTLS turn to low level, and the gate signal VG falls to low level, so that switching device Q1 turns off. At this time, the high-side gate signal HG is at high level. Accordingly, the high-side output pulse signal OUTH goes into a high-impedance state and falls with behavior similar to that of the gate signal VG until it eventually becomes equal to the first and second low-side output pulse signals OUTL and OUTLS (both low level).

When at time t38 the gate signal VG falls below the predetermined threshold value Vth, the second feedback pulse signal OSFBL is pulse-driven with a plurality of pulses (e.g., four pulses). Through this pulse-driving, information on the logic level of the gate signal VG (here, information that VG=L) is fed from the second logic 225 back to the first logic 214.

After time t38, in response to the secondary circuit system 200s being in normal condition, the second feedback pulse signal OSFBL is pulse-driven periodically. Through this periodic pulse-driving, information on the operating state of the secondary circuit system 200s (here, information that it is in normal condition) is fed from the second logic 225 back to the first logic 214.

After time t37 mentioned above, in response to the gate-off capacity selection signal SEL being at high level, the gate-off capacity of the driver 226 is set to the second gate-off capacity (high). Accordingly, the second feedback pulse signal OSFBL is pulse-driven periodically, with two pulses at a time, according to the gate-off capacity of the driver 226. Through this pulse number switching control, information on the gate-off capacity of the driver 226 (here, information that it is second gate-off capacity (high)) is fed from the second logic 225 back to the first logic 214.

At time t39, if the pulse-driving described above has continued for a plurality of periods (e.g., three periods), the second timer signal S2 (not illustrated) turns to high level and also the self-diagnosis signal BIST turns to high level (the logic level corresponding to the second gate-off capacity (high)).

Next, attention is paid to the falling speed of the gate signal VG. As described thus far, the signal transmission device 200 of this embodiment has a function (gate-off capacity switching function) of freely switching the gate-off capacity of the driver 226 according to the gate-off capacity selection signal SEL.

In terms of what is shown in the diagram, when SEL=L, the gate-off capacity of the driver 226 is set to the first gate-off capacity (low). Accordingly, the gate signal VG falls comparatively gently (see, for example, time t32).

By contrast, when SEL=H, the gate-off capacity of the driver 226 is set to the second gate-off capacity (high). Accordingly, the gate signal VG falls comparatively sharply (see, for example, time t37).

With the gate-off capacity switching function described above, it is possible to switch the gate-off capacity of the driver 226 appropriately in accordance with the specifications of the electronic device that incorporates the signal transmission device 200. This makes it possible to prevent an overshoot in the collector volage of the switching device Q1 at its off transition.

<BIST Operation>

Figure 15:
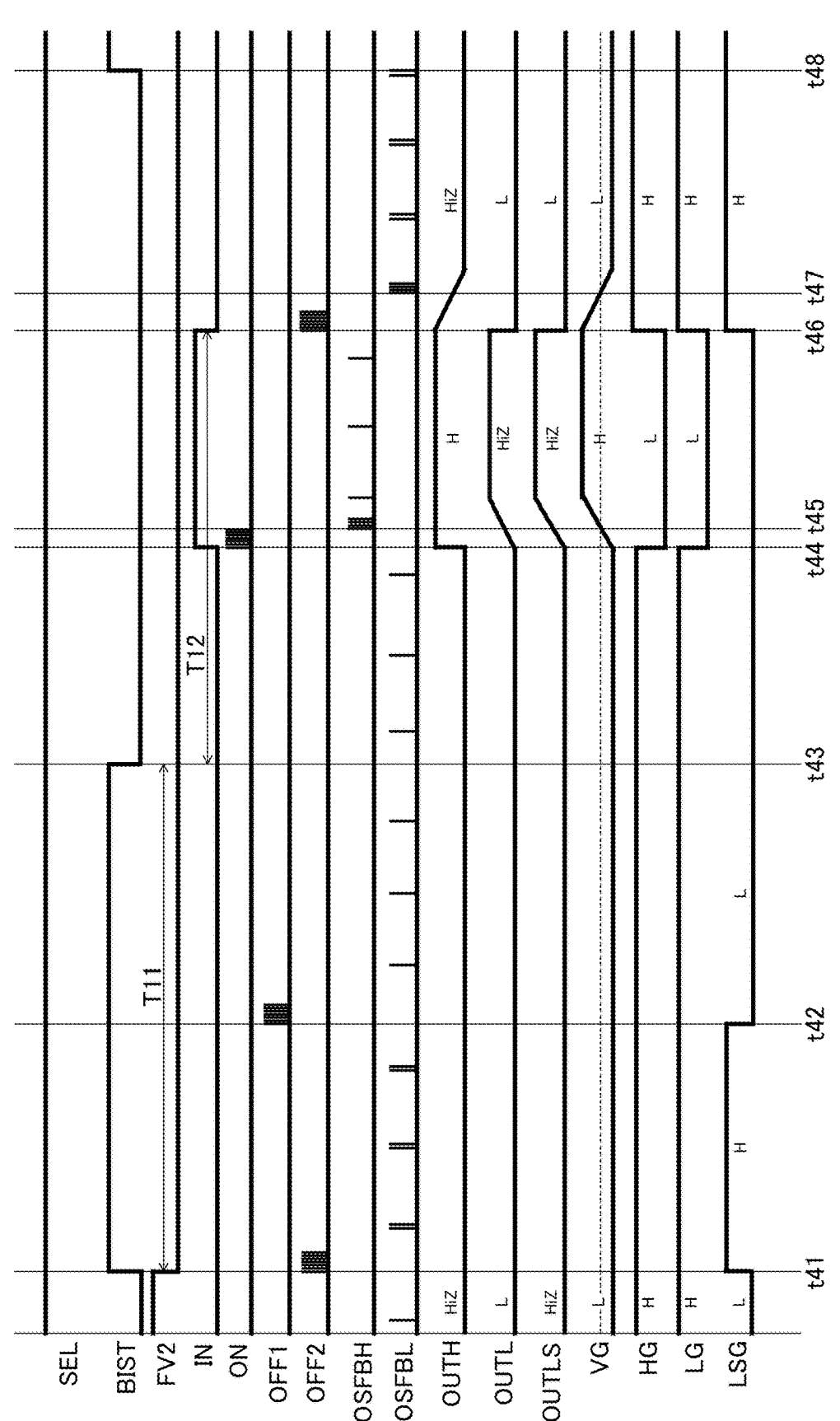
FIG. 15 is a diagram showing a first example (with no fault occurring) of BIST operation.

FIG. 15 is a diagram showing a first example (with no fault occurring) of the BIST operation by the signal transmission device 200 according to the first embodiment, depicting, from top down, the gate-off capacity selection signal SEL, the self-diagnosis signal BIST, the fail signal FV2, the input pulse signal IN, the on signal ON, the first off signal OFF1, the second off signal OFF2, the first feedback pulse signal OSFBH, the second feedback pulse signal OSFBL, the high-side output pulse signal OUTH, the first low-side output pulse signal OUTL, the second low-side output pulse signal OUTLS, the gate signal VG, the high-side gate signal HG, the first low-side gate signal LG, and the second low-side gate signal LSG.

After the start-up of the signal transmission device 200, before time t41, various kinds of protection operation (such as UVLO, OVP, OCP, ISD, and SCP) is in effect, and the fail signal FV2 is at high level (a logic level indicating a fault being detected). In this state, the first low-side gate signal LG is at high level, the first low-side output pulse signal OUTL is at low level, and the gate signal VG is at low level, so that the switching device Q1 is off. In this state, the high-side gate signal HG is at high level and the second low-side gate signal LSG is at low level. Accordingly, the high-side output pulse signal OUTH and the second low-side output pulse signal OUTLS both go into a high-impedance state and become equal to the first low-side output pulse signal OUTL (low level).

When at time t41 the various kinds of protection operation in the signal transmission device 200 are terminated, the fail signal FV2 falls to low level (a logic level indicating no fault being detected). With this as a trigger, in the signal transmission device 200, BIST operation is performed for a predetermined BIST operation period T11 (i.e., between times t41 and t43, e.g. 300 μs). In the BIST operation period T11, the self-diagnosis signal BIST is held at high level and the fail signal FV2 is held at low level.

For example, during the BIST operation period T11 mentioned above, the first logic 214 pulse-drives the first and second off signals OFF1 and OFF2 sequentially regardless of the gate-off capacity selection signal SEL (in the diagram, held at high level). In terms of what is shown in the diagram, the first logic 214 pulse-drives, at time t41, the second off signal OFF2 and subsequently, at time t42, the first off signal OFF1.

Accordingly, between times t41 and t42, the first and second low-side gate signals LG and LSG are both at high level, so that the gate-off capacity of the driver 226 is set to the second gate-off capacity (high). In this period, the second feedback pulse signal OSFBL is pulse-driven periodically, with two pulses at a time, according to the gate-off capacity of the driver 226.

On the other hand, between times t42 and t43, the first low-side gate signal LG is at high level and the second low-side gate signal LSG is at low level, so that the gate-off capacity of the driver 226 is set to the first gate-off capacity (low). In this period, the second feedback pulse signal OSFBL is pulse-driven periodically, with one pulse at a time, according to the gate-off capacity of the driver 226.

Thus the first logic 214 can, by monitoring the number of pulses in the second feedback pulse signal OSFBL output from the second logic 225 (hence the logic level of the second timer signal S2), self-diagnose whether the gate-off capacity of the driver 226 is switched properly. In terms of what is shown in the diagram, during the BIST operation period T11 mentioned above, based on the number of pulses in the second feedback pulse signal OSFBL being switched from two to one, it is possible to diagnose that the gate-off capacity switching function is working properly.

At time t43, the first logic 214 drops the self-diagnosis signal BIST to low level (i.e., a logic level indicating no fault being detected) and releases the fail signal FV2 from the held logic level. Thus the above-described sequence of BIST operation is complete and the signal transmission device 200 makes a transition to an ordinary operation mode.

Note that, in BIST operation, it is preferable, as described above, to first pulse-drive the second off signal OFF2 and then pulse-drive the first off signal OFF1. In other words, it is preferable to set the gate-off capacity of the driver 226 first to the second gate-off capacity (high) and later to the first gate-off capacity (low). Switching the gate-off capacity in BIST operation in this order makes it possible, after the transition of the signal transmission device 200 to the ordinary operation mode, to drive the driver 226 with the first gate-off capacity (low) with no special control. It is thus possible to start up the signal transmission device 200 more safely.

Moreover, as mentioned previously, after the completion of BIST operation, the output terminal for the self-diagnosis signal BIST can be shared as the output terminal for the second timer signal S2 (i.e., information on the gate-off capacity of the driver 226).

In that case, it is preferable to keep the logic level of the self-diagnosis signal BIST (i.e., the diagnosis result of BIST operation) for a predetermined BIST output period T12 even after the transition of the signal transmission device 200 to the ordinary operation mode. For example, the BIST output period T12 (in the diagram, BIST=L) can last after the transition to the ordinary operation mode at time t43 until, with the input pulse signal IN rising to high level at time t44 meanwhile, the input pulse signal IN falls to low level at time t46.

In terms of what is shown in the diagram, when at time t44 the input pulse signal IN is raised to high level, the on signal ON is pulse-driven with a single pulse or a plurality of pulses (e.g., seven pulses). As a result, the high-side output pulse signal OUTH turns to high level and the gate signal VG rises to high level, so that the switching device Q1 turns on. At this time, the first and second low-side gate signals LG and LSG are both at low level. Accordingly, the first and second low-side output pulse signals OUTL and OUTLS both go into a high-impedance state and become equal to the high-side output pulse signal OUTH (high level).

When at time t45 the gate signal VG rises above the predetermined threshold value Vth, the first feedback pulse signal OSFBH is pulse-driven with a plurality of pulses (e.g., 4 pulses). Through this pulse-driving, information on the logic level of the gate signal VG (here, information that VG=H) is fed from the second logic 225 back to the first logic 214.

Between times t45 and t46, in response to the secondary circuit system 200s being in normal condition, the first feedback pulse signal OSFBH is pulse-driven periodically. Through this periodic pulse-driving, information on the operating state of the secondary circuit system 200s (here, information that it is in normal condition) is fed from the second logic 225 back to the first logic 214.

After the first off signal OFF1 is pulse-driven in the BIST operation described previously, the gate-off capacity of the driver 226 is kept to be the first gate-off capacity (low). Accordingly, the first feedback pulse signal OSFBH is pulse-driven periodically, with one pulse at a time, according to the gate-off capacity of the driver 226. Through this pulse number switching control, information on the gate-off capacity of the driver 226 (here, information that it is the first gate-off capacity (low)) is fed from the second logic 225 back to the first logic 214.

If the pulse-driving described above has continued for a plurality of periods (e.g., three periods), the second timer signal S2 (not illustrated) turns to low level and also the self-diagnosis signal BIST turns to low level (i.e., the logic level corresponding to the first gate-off capacity (low)). In the diagram, however, the self-diagnosis signal BIST has been at low level from time t43 and thus the logic level of the self-diagnosis signal BIST does not change.

At time t46, with the gate-off capacity selection signal SEL at high level, the input pulse signal IN is dropped to low level. In this case, the second off signal OFF2 is pulse-driven with a single pulse or a plurality of pulses (e.g., seven pulses). As a result, the first and second low-side gate signals LG and LSG are both turned to high level, the first and second low-side output pulse signals OUTL and OUTLS turn to low level, and the gate signal VG falls to low level, so that the switching device Q1 turns off. At this time, the high-side gate signal HG is at high level. Accordingly, the high-side output pulse signal OUTH goes into a high-impedance state and becomes equal to the first and second low-side output pulse signals OUTL and OUTLS (both low level).

When at time t47 the gate signal VG falls below the predetermined threshold value Vth, the second feedback pulse signal OSFBL is pulse-driven with a plurality of pulses (e.g., four pulses). Through this pulse-driving, information on the logic level of the gate signal VG (here, information that VG=L) is fed from the second logic 225 back to the first logic 214.

Moreover, after time t47, in response to the secondary circuit system 200s being in normal condition, the second feedback pulse signal OSFBL is pulse-driven periodically. Through this periodic pulse-driving, information on the operating state of the secondary circuit system 200s (here, information that it is in normal condition) is fed from the second logic 225 back to the first logic 214.

Moreover, after time t46 mentioned previously, in response to the gate-off capacity selection signal SEL being at high level, the gate-off capacity of the driver 226 is set to the second gate-off capacity (high). Accordingly, the second feedback pulse signal OSFBL is pulse-driven periodically, with two pulses at a time, according to the gate-off capacity of the driver 226. Through this pulse number switching control, information on the gate-off capacity of the driver 226 (here, information that it is second gate-off capacity (high)) is fed from the second logic 225 back to the first logic 214.

Incidentally, at time t48, if the pulse-driving described above has continued for a plurality of periods (e.g., three periods), the second timer signal S2 (not illustrated) turns to high level and also the self-diagnosis signal BIST turns to high level (the logic level corresponding to the second gate-off capacity).

Figure 16:
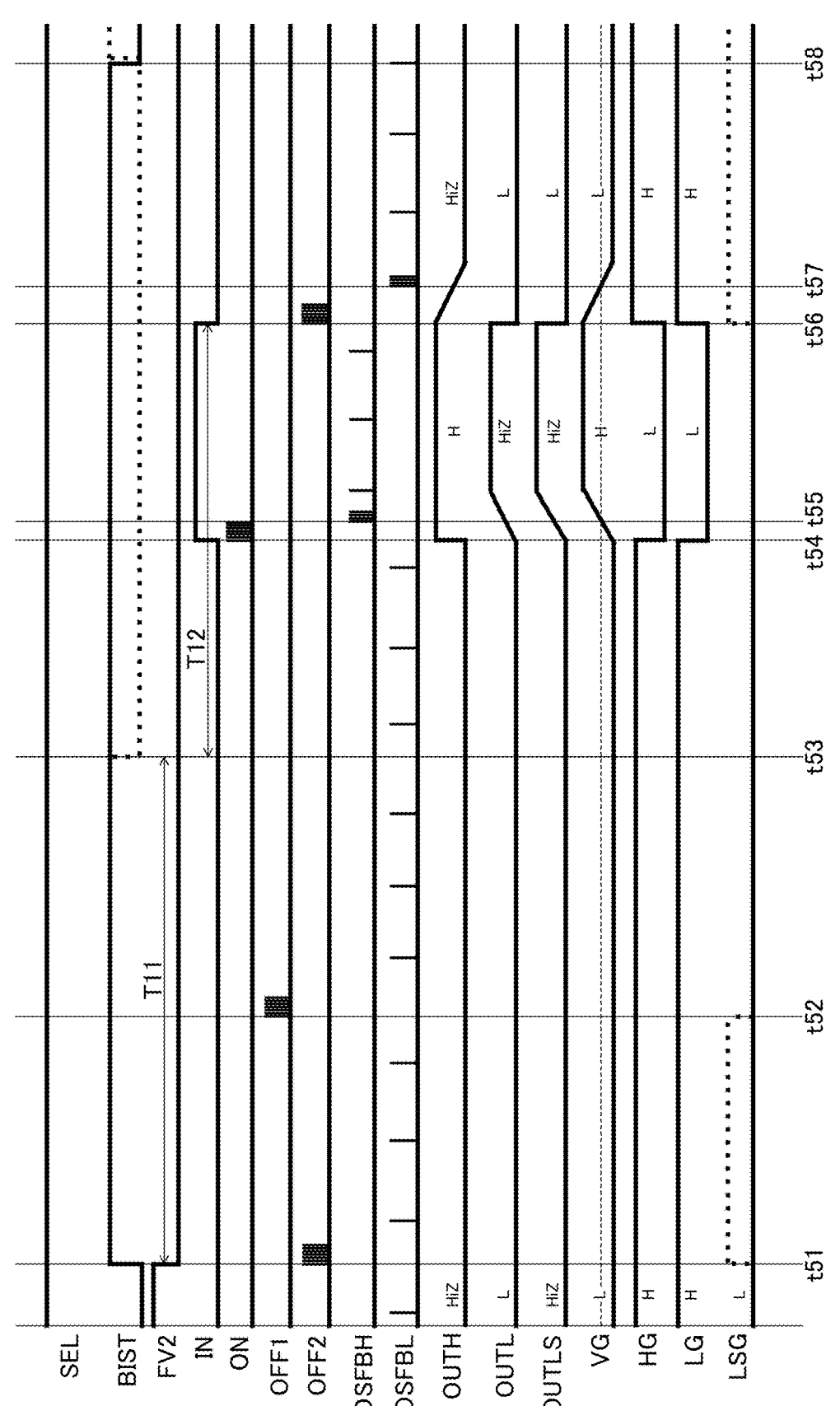
FIG. 16 is a diagram showing a second example (with a fault occurring) of BIST operation.

FIG. 16 is a diagram showing a second example (with a fault occurring) of the BIST operation by the signal transmission device 200 according to the first embodiment, depicting, like FIG. 15 referred to previously, from top down, the gate-off capacity selection signal SEL, the self-diagnosis signal BIST, the fail signal FV2, the input pulse signal IN, the on signal ON, the first off signal OFF1, the second off signal OFF2, the first feedback pulse signal OSFBH, the second feedback pulse signal OSFBL, the high-side output pulse signal OUTH, the first low-side output pulse signal OUTL, the second low-side output pulse signal OUTLS, the gate signal VG, the high-side gate signal HG, the first low-side gate signal LG, and the second low-side gate signal LSG.

Times t51 to t58 in the diagram correspond to times t41 to t48 in FIG. 15, and the behavior of the signals is basically the same as in the first example described previously. Accordingly, no overlapping description will be repeated for similar features as observed in FIG. 15, and the following description focuses on features observed when the gate-off capacity switching function is faulty (see, in particular, the broken lines in the self-diagnosis signal BIST and the second low-side gate signal LSG).

As described thus far, when the second off signal OFF2 is pulse-driven, the first and second low-side gate signals LG and LSG are both supposed to be at high level. However, if the gate-off capacity switching function of the signal transmission device 200 is faulty, as observed between times t51 and t52, even when the second off signal OFF2 is pulse-driven, the second low-side gate signal LSG may be kept at low level.

If a fault like this occurs, the gate-off capacity of the driver 226 is held at the first gate-off capacity (low). Thus, during the BIST operation period T11 (i.e., between times t51 and t53), even when the second and first off signals OFF2 and OFF1 are pulse-driven sequentially, the second feedback pulse signal OSFBL is pulse-driven always with one pulse at a time. As a result, the first logic 214 gives a diagnosis result that the gate-off capacity switching function is not working normally. In this case, even after the completion of BIST operation at time t53, the self-diagnosis signal BIST remains kept at high level (i.e., a logic level indicating a fault being detected).

Incidentally, as mentioned previously, it is preferable to keep the logic level of the self-diagnosis signal BIST (i.e., the diagnosis result of BIST operation) for a predetermined BIST output period T12 even after the transition of the signal transmission device 200 to the ordinary operation mode. For example, the BIST output period T12 (in the diagram, BIST=H) can last after the transition to the ordinary operation mode at time t53 until, with the input pulse signal IN rising to high level at time t54 meanwhile, the input pulse signal IN falls to low level at time t56.

After that, at time t56, with the gate-off capacity selection signal SEL at high level, the input pulse signal IN is dropped to low level. In this case, the second off signal OFF2 is pulse-driven with a single pulse or a plurality of pulses (e.g., seven pulses) and thus the first and second low-side gate signals LG and LSG are both supposed to be at high level. In the diagram, however, because the gate-off capacity switching function is faulty, the second low-side gate signal LSG is kept at low level. As a result, the gate-off capacity of the driver 226 is held at the first gate-off capacity (low), and thus the second feedback pulse signal OSFBL is pulse-driven with only one pulse at a time.

Incidentally, at time t58, if the pulse-driving described above has continued for a plurality of periods (e.g., three periods), the self-diagnosis signal BIST falls to low level (the logic level corresponding to the first gate-off capacity (low)).

Signal Transmission Device (Second Embodiment)

Figure 17:
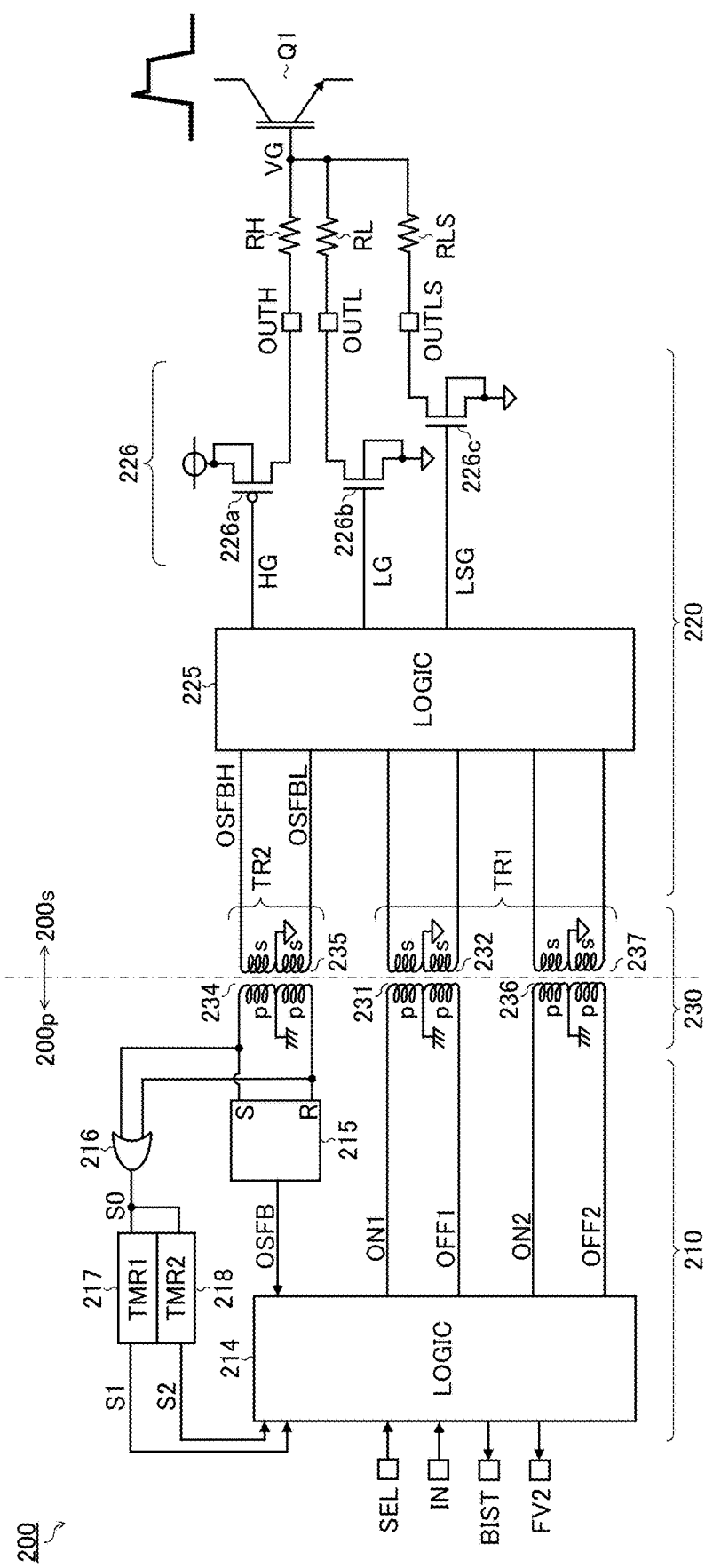
FIG. 17 is a diagram showing a signal transmission device according to a second embodiment.

FIG. 17 is a diagram showing a signal transmission device 200 according to a second embodiment. The signal transmission device 200 of the second embodiment is based on the first embodiment (FIG. 10) described previously and has a slightly modified first transformer circuit TR1.

In terms of what is shown in the diagram, the first transformer circuit TR1 includes, instead of the transformer 233 mentioned previously, transformers 236 and 237, and transmits driving pulse signals (a first on signal ON1, a second on signal ON2, a first off signal OFF1, and a second off signal OFF2) output from the first logic 214 to the second logic 225 while isolating between the primary and secondary circuit systems 200p and 200s.

The transformer 231 outputs the first on signal ON1, which is fed from the first logic 214 to the primary coil 231p, from the secondary coil 231s to the second logic 225. On the other hand, the transformer 232 outputs the first off signal OFF1, which is fed from the first logic 214 to the primary coil 232p, from the secondary coil 232s to the second logic 225. Similarly, the transformer 236 outputs the second on signal ON2, which is fed from the first logic 214 to the primary coil 236p, from the primary coil 236s to the second logic 225. On the other hand, the transformer 237 outputs the second off signal OFF2, which is fed from the first logic 214 to the primary coil 237p, from the primary coil 237s to the second logic 225.

In this case, for example, the transformers 231 and 232 can be integrated into a first, two-channel, transformer chip and the transformers 236 and 237 can likewise integrated into a second, two-channel, transformer chip.

With this configuration, the first transformer circuit TR1 can be formed by use of a plurality of two-channel transformer chips (e.g., of the same lot). This makes it possible to reduce manufacturing variations among individual transformer chips and to achieve as identical signal transmission characteristics (such as signal delays) as possible between the first and second off signals OFF1 and OFF2.

Of the first and second on signals ON1 and ON2, only one can be used as the on signal ON mentioned previously, with the other left unused. Or the OR signal between the first and second on signals ON1 and ON2 can be used as the on signal ON mentioned previously to secure redundancy. Or the gate-off capacity of the driver 226 can be switched according to which of the first and second on signals ON1 and ON2 is pulse-driven.

Overview

To follow is an overview of the various embodiments described above.

For example, according to one aspect of what is disclosed herein, a signal transmission device includes: a first logic configured to be provided in a primary circuit system; a second logic configured to be provided in a secondary circuit system; a driver configured to be provided in the secondary circuit system and to generate a gate signal; a first transformer circuit configured to transmit a driving pulse signal output from the first logic to the second logic while isolating between the primary and secondary circuit systems; and a second transformer circuit configured to transmit a feedback pulse signal output from the second logic to the first logic while isolating between the primary and secondary circuit systems. The second logic has: a function of determining the logic level of the gate signal by driving the driver according to the driving pulse signal; a function of pulse-driving the feedback pulse signal at a predetermined period, with a first number of pulses at a time, if the secondary circuit system is in normal condition; and a function of switching the first number of pulses according to the driving capacity of the driver. (A first configuration.)

In the signal transmission device of the first configuration, the feedback pulse signal can include a first feedback pulse signal and a second feedback pulse signal. The second logic can pulse-drive, when the gate signal is at a first logic level, the first feedback pulse signal and, when the gate signal is at a second logic level, the second feedback pulse signal. (A second configuration.)

In the signal transmission device of the second configuration, the second logic can further have a function of, at the timing that the gate signal turns to the first logic level, pulse-driving the first feedback pulse signal with a second number of pulses and, at the timing that the gate signal turns to the second logic level, pulse-driving the second feedback pulse signal with the second number of pulses. (A third configuration.)

In the signal transmission device of any of the first to third configurations, the driving capacity of the driver can be, when a selection signal is at a third logic level, a first driving capacity and, when the selection signal is at a fourth logic level, a second driving capacity. (A fourth configuration.)

In the signal transmission device of the fourth configuration, the driving pulse signal can include a first driving pulse signal and a second driving pulse signal. The first logic can pulse-drive, when the selection signal is at the third logic level, the first driving pulse signal and, when the selection signal is at the fourth logic level, the second driving pulse signal. (A fifth configuration.)

In the signal transmission device of the fifth configuration, the driver can include a first driving transistor and a second driving transistor. The second logic can drive, according to the first driving pulse signal, only the first driving transistor and, according to the second driving pulse signal, both the first and second driving transistors. (A sixth configuration.)

In the signal transmission device of the fifth or sixth configuration, the first logic can have a function of driving the first and second driving pulse signals sequentially regardless of the selection signal and, based on the feedback pulse signal from the second logic, self-diagnosing whether the driving capacity of the driver is switched properly. (A seventh configuration.)

In the signal transmission device of any of the first to seventh configurations, a first chip having the first logic integrated in it, a second chip having the second logic and the driver integrated in it, and a third chip having the first and second transformer circuits integrated in it can be sealed in a single package. (An eighth configuration.)

According to another aspect of what is disclosed herein, an electronic device includes: a switching element configured to be driven with the gate signal; and the signal transmission device of any of the first to eighth configurations. (A ninth configuration.)

In the electronic device of the ninth configuration, the switching element can be an IGBT or an FET. (A tenth configuration.)

According to the disclosure herein, it is possible to provide a signal transmission device that can properly perform feedback operation from the secondary circuit system to the primary circuit system, and to provide an electronic device that employs such a signal transmission device.

The various technical features disclosed herein may be implemented in any manners other than as in the embodiments described above, and allow for many modifications without departure from the spirit of their technical ingenuity. For example, any bipolar transistor may be replaced with a MOS field-effect transistor and vice versa; the logic levels of any signal may be reversed. That is, the embodiments described above should be taken to be in every aspect illustrative and not restrictive, and the technical scope of the present disclosure should be understood to be defined not by the description of the embodiments given above but by the appended claims and encompasses any modifications within a scope and sense equivalent to those claims.

The invention claimed is:

1. A signal transmission device comprising:
a first logic configured to be provided in a primary circuit system;
a second logic configured to be provided in a secondary circuit system;
a driver configured to be provided in the secondary circuit system and to generate a gate signal;
a first transformer circuit configured to transmit a driving pulse signal output from the first logic to the second logic while isolating between the primary and secondary circuit systems; and
a second transformer circuit configured to transmit a feedback pulse signal output from the second logic to the first logic while isolating between the primary and secondary circuit systems,
wherein
the second logic has:
a function of determining a logic level of the gate signal by driving the driver according to the driving pulse signal;
a function of pulse-driving the feedback pulse signal at a predetermined period, with a first number of pulses at a time, if the secondary circuit system is in normal condition; and
a function of switching the first number of pulses according to a driving capacity of the driver,
wherein
the signal transmission device comprises first, second and third output terminals configured to connect to a gate of an external switching device,
wherein
the first output terminal is configured to provide a first output pulse signal to turn on the external switching device,
the second and third output terminals are configured to output second and third output pulse signals, respectively, to turn off the external switching device, and
the second logic is configured to switch the first number of pulses based on whether just the second output terminal is outputting the second output pulse signal, or both the second and third terminals are outputting the second and third output pulse signals respectively.

2. The signal transmission device according to claim 1, wherein the feedback pulse signal includes a first feedback pulse signal and a second feedback pulse signal, the second logic pulse-drives, when the gate signal is at a first logic level, the first feedback pulse signal and, when the gate signal is at a second logic level, the second feedback pulse signal.

3. The signal transmission device according to claim 2, wherein the second logic further has a function of, at a timing that the gate signal turns to the first logic level, pulse-driving the first feedback pulse signal with a second number of pulses and, at a timing that the gate signal turns to the second logic level, pulse-driving the second feedback pulse signal with the second number of pulses.

4. The signal transmission device according to claim 1, wherein the driving capacity of the driver is, when a selection signal is at a third logic level, a first driving capacity and, when the selection signal is at a fourth logic level, a second driving capacity.

5. The signal transmission device according to claim 4, wherein the driving pulse signal includes a first driving pulse signal and a second driving pulse signal, the first logic pulse-drives, when the selection signal is at the third logic level, the first driving pulse signal and, when the selection signal is at the fourth logic level, the second driving pulse signal.

6. The signal transmission device according to claim 5, wherein the driver includes a first driving transistor and a second driving transistor, and the second logic drives, according to the first driving pulse signal, only the first driving transistor and, according to the second driving pulse signal, both the first and second driving transistors.

7. The signal transmission device according to claim 5, wherein the first logic has a function of driving the first and second driving pulse signals sequentially regardless of the selection signal and, based on the feedback pulse signal from the second logic, self-diagnosing whether the driving capacity of the driver is switched properly.

8. The signal transmission device according to claim 1, wherein a first chip having the first logic integrated therein, a second chip having the second logic and the driver integrated therein, and a third chip having the first and second transformer circuits integrated therein are sealed in a single package.

9. An electronic device comprising:
a switching element configured to be driven with a gate signal; and
the signal transmission device according to claim 1.

10. The electronic device according to claim 9, wherein the switching element is an IGBT or an FET.

11. A signal transmission device comprising:
a first logic configured to be provided in a primary circuit system;
a second logic configured to be provided in a secondary circuit system;
a driver in the secondary circuit system, wherein the driver is configured to generate a gate signal;
a first transformer circuit configured to transmit a driving pulse signal output from the first logic to the second logic while isolating between the primary circuit system and the secondary circuit system; and
a second transformer circuit configured to transmit a feedback pulse signal output from the second logic to the first logic while isolating between the primary circuit system and the secondary circuit system, wherein the second logic is configured to:

determine a logic level of the gate signal by driving the driver according to the driving pulse signal;

pulse-drive the feedback pulse signal at a predetermined period, with a first number of pulses at a time, based on the secondary circuit system being in a normal condition; and switch the first number of pulses according to a driving capacity of the driver, wherein the driving capacity is a gate-off capacity to turn off an external switching device.

12. The signal transmission device according to claim 11, wherein the feedback pulse signal includes a first feedback pulse signal and a second feedback pulse signal, the second logic is configured to pulse-drive, based on the gate signal being at a first logic level, the first feedback pulse signal and is configured to pulse-drive, based on the gate signal being at a second logic level, the second feedback pulse signal.

13. The signal transmission device according to claim 12, wherein the second logic further is configured to, at a timing that the gate signal turns to the first logic level, pulse-drive the first feedback pulse signal with a second number of pulses and is configured to, at a timing that the gate signal turns to the second logic level, pulse-drive the second feedback pulse signal with the second number of pulses.

14. The signal transmission device according to claim 11, wherein the driving capacity of the driver comprises, based on a selection signal being at a third logic level, a first driving capacity and, based the selection signal is at a fourth logic level, a second driving capacity.

15. The signal transmission device according to claim 14, wherein the driving pulse signal includes a first driving pulse signal and a second driving pulse signal, the first logic is configured to pulse-drive, based on the selection signal being at the third logic level, the first driving pulse signal and is configured to pulse-drive, based on the selection signal being at the fourth logic level, the second driving pulse signal.

16. The signal transmission device according to claim 15, wherein the driver includes a first driving transistor and a second driving transistor, and the second logic is configured to drive, according to the first driving pulse signal, only the first driving transistor and, according to the second driving pulse signal, both the first and second driving transistors.

17. The signal transmission device according to claim 15, wherein the first logic is configured to drive the first and second driving pulse signals sequentially regardless of the selection signal and to, based on the feedback pulse signal from the second logic, self-diagnose whether the driving capacity of the driver is switched properly.

18. The signal transmission device according to claim 11, wherein a first chip having the first logic integrated therein, a second chip having the second logic and the driver integrated therein, and a third chip having the first and second transformer circuits integrated therein are sealed in a single package.

19. An electronic device comprising:

a switching element configured to be driven with the gate signal; and the signal transmission device according to claim 11.

20. The electronic device according to claim 19, wherein the switching element is an IGBT or an FET.

* * * * *